(12) United States Patent
Ly et al.

(10) Patent No.: US 12,391,570 B2
(45) Date of Patent: Aug. 19, 2025

(54) METHODS OF THE ULTRA-CLEAN TRANSFER OF TWO-DIMENSIONAL MATERIALS

(71) Applicant: CITY UNIVERSITY OF HONG KONG, Kowloon (HK)

(72) Inventors: Thuc Hue Ly, Kowloon (HK); Haijun Liu, Kowloon (HK)

(73) Assignee: CITY UNIVERSITY OF HONG KONG, Kowloon (HK)

( * ) Notice: Subject to any disclaimer, the term of this patent is extended or adjusted under 35 U.S.C. 154(b) by 205 days.

(21) Appl. No.: 18/314,131

(22) Filed: May 8, 2023

(65) Prior Publication Data

US 2023/0373810 A1   Nov. 23, 2023

Related U.S. Application Data

(60) Provisional application No. 63/344,970, filed on May 23, 2022.

(51) Int. Cl.
| | |
|---|---|
| *C01G 39/06* | (2006.01) |
| *C23C 16/01* | (2006.01) |
| *H01J 37/20* | (2006.01) |
| *H01J 37/26* | (2006.01) |

(52) U.S. Cl.
CPC .............. *C01G 39/06* (2013.01); *C23C 16/01* (2013.01); *H01J 37/20* (2013.01); *C01P 2004/02* (2013.01); *C01P 2004/04* (2013.01); *C01P 2004/24* (2013.01); *H01J 37/26* (2013.01)

(58) Field of Classification Search
CPC .. C01G 39/06; C01P 2004/02; C01P 2004/04; C01P 2004/24; C23C 16/01; C23C 16/26; C23C 16/305; C23C 16/342; G01N 1/2813; H01J 37/20; H01J 37/26; B05D 5/00; B05D 5/10
USPC ... 156/60, 80, 155, 230, 247, 249, 278, 701, 156/703, 711
See application file for complete search history.

(56) References Cited

U.S. PATENT DOCUMENTS

| | | | | |
|---|---|---|---|---|
| 3,921,368 A | * | 11/1975 | Hanley | ............... B65B 51/02 |
| | | | | 156/80 |
| 3,992,236 A | * | 11/1976 | Wanesky | ............ H01L 21/6835 |
| | | | | 156/83 |

(Continued)

FOREIGN PATENT DOCUMENTS

| | | |
|---|---|---|
| CN | 108821273 B | 11/2018 |
| JP | 5840772 B2 | 1/2016 |

OTHER PUBLICATIONS

Liu, et al., "Controlled Adhesion of Ice—Toward Ultraclean 2D Materials", Advanced Materials, 2023, vol. 35, 2210503.

(Continued)

*Primary Examiner* — Philip C Tucker
*Assistant Examiner* — Brian R Slawski
(74) *Attorney, Agent, or Firm* — Conley Rose, P.C.; Michael W. Piper; Gayatry Nair

(57) ABSTRACT

Disclosed herein are methods for transferring two-dimensional (2D) materials between substrates with the aid of ice, in which the ice serves as a supporting layer for the transfer of the 2D materials. The methods include the transfer of materials such as the 2D materials between substrates including the ice-aided transfer of ultra-clean materials.

22 Claims, 30 Drawing Sheets

(56) References Cited

U.S. PATENT DOCUMENTS

| | | | |
|---|---|---|---|
| 7,070,669 B1* | 7/2006 | White | H10N 30/073 156/247 |
| 11,180,367 B2 | 11/2021 | Vijayaraghavan et al. | |
| 2015/0274519 A1* | 10/2015 | Wei | B82Y 40/00 156/80 |

OTHER PUBLICATIONS

Leong, W. S. et al., "Paraffin-enabled graphene transfer", Nat Commun 10, 867, doi:10.1038/s41467-019-08813-x (2019).
Zhang, T. et al., "Clean Transfer of 2D Transition Metal Dichalcogenides Using Cellulose Acetate for Atomic Resolution Characterizations", ACS Applied Nano Materials 2, 5320-5328 (2019).
Shivayogimath, Abhay, et al. "Do-it-yourself transfer of large-area graphene using an office laminator and water." Chemistry of Materials 31.7 (2019): 2328-2336.
K. S. Novoselov, et al., "A roadmap for graphene", Nature 2012, 490, 192.
Q. H. Wang, et al., "Electronics and optoelectronics of two-dimensional transition metal dichalcogenides", Nat. Nanotechnol. 2012, 7, 699.
X. He, et al., Chemical Vapor Deposition of High-Quality and Atomically Layered ReS 2, Small 2015, 11, 5423.
Y. H. Lee, et al., "Synthesis of Large-Area MoS 2 Atomic Layers with Chemical Vapor Deposition", Adv. Mater. 2012, 24, 2320.
X. Li, et al., "Large-Area Synthesis of High-Quality and Uniform Graphene Films on Copper Foils", Science 2009, 324, 1312.
W. Zhang, et al., "High-Gain Phototransistors Based on a CVD MoS2 Monolayer", Adv. Mater., 2013, 25, 3456.
X. Li, et al., "Transfer of Large-Area Graphene Films for High-Performance Transparent Conductive Electrodes", Nano Lett. 2009, 9, 4359.
J. W. Suk, et al., "Transfer of CVD-Grown Monolayer Graphene onto Arbitrary Substrates", ACS Nano 2011, 5, 6916.
Y. Wang, et al., "Electrochemical Delamination of CVDGrown Graphene Film: Toward the Recyclable Use of Copper Catalyst", ACS Nano 2011, 5, 9927.
A. Gurarslan, et al., "Surface-Energy-Assisted Perfect Transfer of Centimeter-Scale Monolayer and Few-Layer MoS2 Films onto Arbitrary Substrates", ACS Nano 2014, 8, 11522.
Y. H. Lee, et al., "Synthesis and Transfer of Single-Layer Transition Metal Disulfides on Diverse Surfaces", Nano Lett. 2013, 13, 1852.
H. H. Kim, et al., "Clean Transfer of Wafer-Scale Graphene via Liquid Phase Removal of Polycyclic Aromatic Hydrocarbons", ACS Nano 2015, 9, 4726.
L. A. Belyaeva, et al., "Molecular Caging of Graphene with Cyclohexane: Transfer and Electrical Transport", ACS Cent Sci 2016, 2, 904.
W. S. Leong, et al., "Paraffin-enabled graphene transfer", Nat. Commun. 2019, 10, 867.
S. Kim, et al., "Robust graphene wet transfer process through low molecular weight polymethylmethacrylate", Carbon 2016, 98, 352.
Z. Zhang, et al., "Rosin-enabled ultraclean and damage-free transfer of graphene for large-area flexible organic light-emitting diodes", Nat. Commun. 2017, 8, 14560.
H. Li, et al., "A Universal, Rapid Method for Clean Transfer of Nanostructures onto Various Substrates", ACS Nano 2014, 8, 6563.
T. Zhang, et al., "Clean Transfer of 2D Transition Metal Dichalcogenides Using Cellulose Acetate for Atomic Resolution Characterizations", ACS Appl. Nano Mater. 2019, 2, 5320.
J. D. Caldwell, et al., "Technique for the Dry Transfer of Epitaxial Graphene onto Arbitrary Substrates", ACS Nano 2010, 4, 1108.
A. R. Madaria, et al., "Uniform, Highly Conductive, and Patterned Transparent Films of a Percolating Silver Nanowire Network on Rigid and Flexible Substrates Using a Dry Transfer Technique", Nano Res. 2010, 3, 564.
S. Son, et al., "Strongly adhesive dry transfer technique for van der Waals heterostructure", 2D Mater. 2020, 7, 041005.
B. Jang, et al., "Damage mitigation in roll-to-roll transfer of CVD-graphene to flexible substrates", 2D Mater. 2017, 4, 024002.
M. A. Meitl, et al., "Transfer printing by kinetic control of adhesion to an elastomeric stamp", Nature Mater. 2005, 5, 33.
T. Uwanno, et al., "Fully dry PMMA transfer of graphene on h-BN using a heating/cooling system", 2D Mater. 2015, 2, 041002.
J. Song, et al., "A general method for transferring graphene onto soft surfaces", Nat. Nanotechnol. 2013, 8, 356.
P. Bampoulis, et al., "Hydrophobic Ice Confined between Graphene and MoS2", Phys. Chem. C 2016, 120, 27079.
K. Kwac, et al., "Multilayer Two-Dimensional Water Structure Confined in MoS2", Phys. Chem. C 2017, 121, 16021.
T. Chen, et al., "Influence of substrate initial temperature on adhesion strength of ice on aluminum alloy", Cold Reg. Sci. Technol. 2018, 148, 142.
Z. A. Janjua, "The influence of freezing and ambient temperature on the adhesion strength of ice", Cold Reg. Sci. Technol. 2017, 140, 14.
K. Matsumoto, et al., "Temperature-dependency on adhesion force of ice made from surfactant-pure water mixture to copper surface", Int. J. Refrig. 2017, 79, 39.
S. A. Kulinich, et al., "How Wetting Hysteresis Influences Ice Adhesion Strength on Superhydrophobic Surfaces", Langmuir 2009, 25, 8854.
K. K. Varanasi, et al., "Frost formation and ice adhesion on superhydrophobic surfaces", Appl. Phys. Lett. 2010, 97.
A. J. Meuler, et al., "Relationships between Water Wettability and Ice Adhesion", ACS Appl. Mater. Interfaces 2010, 2, 3100.
M. E. Schrader, "Young-Dupre Revisited", Langmuir 1995, 11, 3585.
L. Makkonen, J., "Surface Melting of Ice", Phys. Chem. B 1997, 101, 6196.
L. Makkonen, J., "Ice Adhesion—Theory, Measurements and Countermeasures", Adhes. Sci. Technol. 2012, 26, 413.
D. Akinwande, et al., "Graphene and two-dimensional materials for silicon technology", Nature 2019, 573, 507.
B. N. Chandrashekar, et al., "Roll-to-Roll Green Transfer of CVD Graphene onto Plastic for a Transparent and Flexible Triboelectric Nanogenerator", Adv. Mater. 2015, 27, 5210.
A. Lied, et al., "Surface Melting of Ice Ih Single Crystals Revealed by Glancing Angle X-Ray Scattering", Phys. Rev. Lett. 1994, 72, 3554.
I. Pickering, et al., "Grand Canonical Investigation of the Quasi Liquid Layer of Ice: Is It Liquid?", Phys. Chem. B 2018, 122, 4880.
S. Lai, et al., "Water-penetration-assisted mechanical transfer of large-scale molybdenum disulfide onto arbitrary substrates", RSC Adva. 2016, 6, 57497.
Q. H. Thi, et al., "Coating two-dimensional MoS2 with polymer creates a corrosive non-uniform interface", NPJ 2D Mater. Appl. 2018, 2, 1.
Y. Wang, et al., "Van der Waals contacts between three-dimensional metals and two-dimensional semiconductors", Nature 2019, 568, 70.
C. D. English, et al., "Improved Contacts to MoS2 Transistors by Ultra-High Vacuum Metal Deposition", Nano lett. 2016, 16, 3824.
B. Radisavljevic, et al., "Single-layer MoS2 transistors", Nat. Nanotechnol. 2011, 6, 147.
Y. C. Shen, et al., "Rational Design on Wrinkle-Less Transfer of Transition Metal Dichalcogenide Monolayer by Adjustable Wettability-Assisted Transfer Method", Adv. Funct. Mater. 2021, 31, 2104978.
W. Park, et al., "Photoelectron Spectroscopic Imaging and Device Applications of Large-Area Patternable Single-Layer MoS2 Synthesized by Chemical Vapor Deposition", ACS Nano 2014, 8, 4961.
Y. C. Lin, et al., "Graphene Annealing: How Clean Can It Be?", Nano Lett. 2012, 12, 414.
G. Cunge, , et al., "Dry efficient cleaning of poly-methylmethacrylate residues from graphene with high-density H2 and H2—N2 plasmas", Appl. Phys. 2015, 118, 123302.
Z. Cheng, et al., "Toward Intrinsic Graphene Surfaces: A Systematic Study on Thermal Annealing and Wet-Chemical Treatment of SiO2-Supported Graphene Devices", Nano Lett. 2011, 11, 767.
J. D. Wood, et al., "Annealing free, clean graphene transfer using alternative polymer scaffolds", Nanotechnology 2015, 26, 055302.

(56) References Cited

OTHER PUBLICATIONS

Q. Su, et al., "Ultraclean Graphene Transfer Using a Sacrificial Fluoropolymer Nanolayer: Implications for Sensor and Electronic Applications", ACS Appl. Nano Mater. 2020, 3, 11998.
K. S. Novoselov, et al., "Electric Field Effect in Atomically Thin Carbon Fields", Science 2004, 306, 666.

\* cited by examiner

200

S210 — applying a small droplet of water onto the surface of a supporting substrate

S220 — covering the supporting substrate with the growth substrate via aligning the growth substrate with the 2D material facing toward the supporting substrate so that the water droplet on the supporting substrate is pressed into a thin film and the 2D material of the growth substrate is immersed in the thin film of water thereby forming a first sandwich structure

S230 — maintaining the first sandwich structure of step S220 at a temperature between 20°C to 80°C for at least 10 seconds

S240 — lowering the temperature of the first sandwich structure of step S230 until the thin film of water turns into a thin film of ice

S250 — peeling off the growth substrate from the first sandwich structure of step S240 thereby forming an intermediate structure

FIG. 2B (d)

METHODS OF THE ULTRA-CLEAN TRANSFER OF TWO-DIMENSIONAL MATERIALS

CROSS-REFERENCES TO RELATED APPLICATIONS

This application claims priority and the benefit of U.S. Provisional Patent Application No. 63/344,970, filed May 23, 2022, the entirety of which is incorporated herein by reference.

BACKGROUND OF THE INVENTION

1. Field of the Invention

The present invention, in general, relates to the transfer of materials between substrates; and more particularly, to the ice-aided transfer of ultra-clean materials.

2. Description of Related Art

Two-dimensional (2D) atomic layered materials such as graphene and transition metal dichalcogenide monolayers (TMDs) are currently at the research forefront. A myriad of strategies has been developed for the preparation of 2D materials. Among them, the most promising high-yield and high-quality synthesis approach for 2D materials is chemical vapor deposition (CVD). However, the CVD grown 2D materials usually need to be transferred onto other substrates for characterization (e.g., spectroscopy and microscopy) and further applications and integration (e.g., device fabrication). So far, the types of CVD growth substrates for 2D materials are still limited. Therefore, to expand and realize the application potentials for 2D materials, it is appealing to develop facile, versatile, and reliable large-scale transfer techniques for 2D materials.

Generally, the transfer methods for 2D materials could be classified into wet transfer and dry transfer. In wet transfer, chemical etching or bubbling delamination could be applied to transfer the samples grown on metal substrates; while the samples grown on dielectric substrates such as mica or sapphire can be transferred by a surface-energy-assisted method (Gurarslan et al., ACS Nano. 2014, 8, 11522; Lee et al., Nano Lett. 2013, 13, 1852). In both cases, a polymer supporting layer (e.g., Polymethyl methacrylate (PMMA)) is essential for protecting the 2D materials from tensile strain and perturbation on the liquid surface during transfer process. Unfortunately, this polymer-assisted transfer process suffers from impurities induced by the inevitable polymer residues, which undermine the electronic and optical properties of 2D materials. Moreover, the required volatile toxic solvents such as acetone to remove the polymer layers ask for special handling and disposal precautions. To overcome these issues, efforts have been taken to substitute the conventional PMMA supporting layer, and some have obtained encouraging results, with improved integrity and cleanliness, yet the organic and hydrocarbon residue problems remain unsolved. Currently, the conventional PMMA wet transfer method is still dominant in the 2D material research labs.

On the other hand, dry transfer, which uses an elastomer stamp as supporting materials, is an alternative to wet transfer owing to its precision, controllability, and no liquid involved. However, structure damages and cracks are very likely to occur because the mechanical pressing of the elastomer stamp triggers the deformation of supporting elastomer, which is over the elastic limit of 2D materials (Jang et al., 2D Mater. 2017, 4, 024002). The incomplete release owing to the strong adhesion between the supporting layer and 2D materials also potentially breaks the 2D layers. Although some works applied temperature control to kinetically adjust the adhesion of elastomer stamps (Meitl et al., Nat. Mater. 2005, 5, 33; Uwanno et al., 2D Mater. 2015, 2, 041002), the improvement for their stability and repeatability is ongoing. In addition, the low-molecular-weight organic or polymer molecules present in the elastomer stamp inevitably cause contamination on the transferred samples (Song et al., Nat. Nanotechnol. 2013, 8, 356), especially when heating and pressing are applied during the stamping process.

Hence, there exists in the related art a need of an improved method for the transfer of 2D materials without contamination while maintaining the integrity and properties of the 2D materials after transfer.

SUMMARY

Embodiments of the present disclosure relate to methods of transferring 2D materials from one substrate to another substrate.

The first aspect of the present disclosure aims at providing a method for transferring a two-dimensional (2D) material formed on a growth substrate to a target substrate. The method includes steps of:

(a) applying a water droplet on the target substrate;
(b) covering the target substrate with the growth substrate via aligning the growth structure with the 2D material facing down toward the target substrate so that the water droplet on the target substrate is pressed into a thin film of water and the 2D material on the growth substrate is immersed in the thin film of water thereby forming a sandwich structure;
(c) maintain the sandwich structure of step (b) at a temperature between 20° C. to 80° C. for at least 10 seconds;
(d) lowering the temperature of the sandwich structure of step (c) until the thin film of water turns into a thin film of ice;
(e) peeling off the growth substrate from the sandwich structure of step (d) thereby forming an intermediate structure; and
(f) removing the thin film of ice from the intermediate structure of step (e) thereby transferring the 2D material onto the target substrate.

According to embodiments of the present disclosure, in step (b), the thin film of water has a thickness of 20 to 200 µm. Preferably, the thin film of water has a thickness of 130 µm.

According to embodiments of the present disclosure, in step (d), the temperature of the sandwich structure is lowered at a rate of 5° C./min to −10° C. to −30° C. Preferably, the temperature of the sandwich structure is lowered to −20° C.

According to embodiments of the present disclosure, in step (f), the thin film of ice is removed via natural thawing, heating, or freeze-drying.

According to embodiments of the present disclosure, the 2D material is a flake or a continuous film of graphene, hexagonal boron nitride (hBN), mxeme, transitional metal dichalcogenide, transitional metal oxide, or doubled hydroxide. In some embodiments, the 2D material is the continuous film of transitional metal dichalcogenide selected from the group consisting of $MoS_2$, $ReS_2$, $WS_2$, $MoSe_2$, and $ReSe_2$.

In other embodiments, the 2D material is the continuous file of transitional metal oxide of $Bi_2O_2Se$. In further embodiments, the 2D material is the flake of doubled hydroxide is hydrotalcite.

According to embodiments of the present disclosure, the growth substrate is made of one or more material selected from the group consisting of silicone dioxide, metal, fluorophlogopite, sapphire and a combination thereof; and the target substrate is made of one or more material selected from the group consisting of, carbon, silicone dioxide, glass, ceramic, metal, fluorophlogopite, sapphire, thermoplastic, and a combination thereof.

Examples of the metal suitable for use in the present disclosure include, but are not limiting to, copper (Cu), nickel (Ni), platinum (Pt), and gold (Au).

Examples of the thermoplastic suitable for use in the present disclosure include, but are not limiting to, polycarbonate (PC), polydimethylsiloxane (PDMS), polyethylene (PE), poly(ethylene terephthalate) (PET), polypropylene (PP), polyvinylchloride (PVC), poly(methyl methacrylate) (PMMA), polystyrene (PS), and epoxy resin.

According to some embodiments of the present disclosure, the target substrate is a transmission electron microscopy (TEM) grid consisting of, from top to bottom, a layer of the carbon, a layer of the thermoplastic, and a layer of copper.

The second aspect of the present disclosure aims at providing a method for transferring a 2D material formed on a growth substrate to a target substrate, preferably, a hydrophobic target substrate (e.g., PET, PMMA and the like). The method includes steps of:

(a) applying a water droplet on a supporting substrate;
(b) covering the supporting substrate with the growth substrate via aligning the growth substrate with the 2D material facing toward the supporting substrate so that the water droplet on the supporting substrate is pressed into a thin film and the 2D material of the growth substrate is immersed in the thin film of water thereby forming a first sandwich structure;
(c) maintaining the first sandwich structure at a temperature between 20° C. to 80° C. for at least 10 seconds;
(d) lowering the temperature of the first sandwich structure of step (c) until the thin film of water turns into a thin film of ice;
(e) peeling off the growth substrate from the first sandwich structure of step (d) thereby forming an intermediate structure;
(f) aligning the intermediate structure of step (e) with the thin film of ice facing toward the target substrate thereby forming a second sandwich structure; and
(g) removing the thin film of ice from the second sandwich structure of step (f) thereby transferring the 2D material onto the target substrate.

According to embodiments of the present disclosure, in step (b), the thin film of water has a thickness of 20 to 200 µm. Preferably, the thin film of water has a thickness of 130 µm.

According to embodiments of the present disclosure, in step (d), the temperature of the sandwich structure is lowered at a rate of 5° C./min to −10° C. to −30° C. Preferably, the temperature of the sandwich structure is lowered to −20° C.

According to embodiments of the present disclosure, the 2D material is a flake or a continuous film of graphene, hexagonal boron nitride (hBN), mxeme, transitional metal dichalcogenide, transitional metal oxide, or doubled hydroxide. In some embodiments, the 2D material is the continuous film of transitional metal dichalcogenide selected from the group consisting of $MoS_2$, $ReS_2$, $WS_2$, $MoSe_2$, and $ReSe_2$. In other embodiments, the 2D material is the continuous film of transitional metal oxide of $Bi_2O_2Se$. In further embodiments, the 2D material is the flake of doubled hydroxide is hydrotalcite.

According to embodiments of the present disclosure, the growth substrate is made of one or more material selected from the group consisting of silicone dioxide, metal, fluorophlogopite, sapphire and a combination thereof; and the target substrate is made of one or more material selected from the group consisting of, carbon, silicone dioxide, glass, ceramic, metal, fluorophlogopite, sapphire, thermoplastic, and a combination thereof.

Examples of the metal suitable for use in the present disclosure include, but are not limiting to, copper (Cu), nickel (Ni), platinum (Pt), and gold (Au).

Examples of the thermoplastic suitable for use in the present disclosure include, but are not limiting to, polycarbonate (PC), polydimethylsiloxane (PDMS), polyethylene (PE), poly(ethylene terephthalate) (PET), polypropylene (PP), polyvinylchloride (PVC), poly(methyl methacrylate) (PMMA), polystyrene (PS), and epoxy resin.

According to some embodiments of the present disclosure, the target substrate is a transmission electron microscopy (TEM) grid consisting of, from top to bottom, a layer of the carbon, a layer of the thermoplastic, and a layer of copper.

According to embodiments of the present disclosure, in step (g), the thin film of ice is removed via natural thawing, heating, or freeze-drying.

Other and further embodiments of the present disclosure are described in more detail below.

BRIEF DESCRIPTION OF THE DRAWINGS

The disclosure will become more fully understood from the detailed description and the drawings given herein below for illustration only, and thus does not limit the disclosure, wherein.

DETAILED DESCRIPTION

Figure 1A:
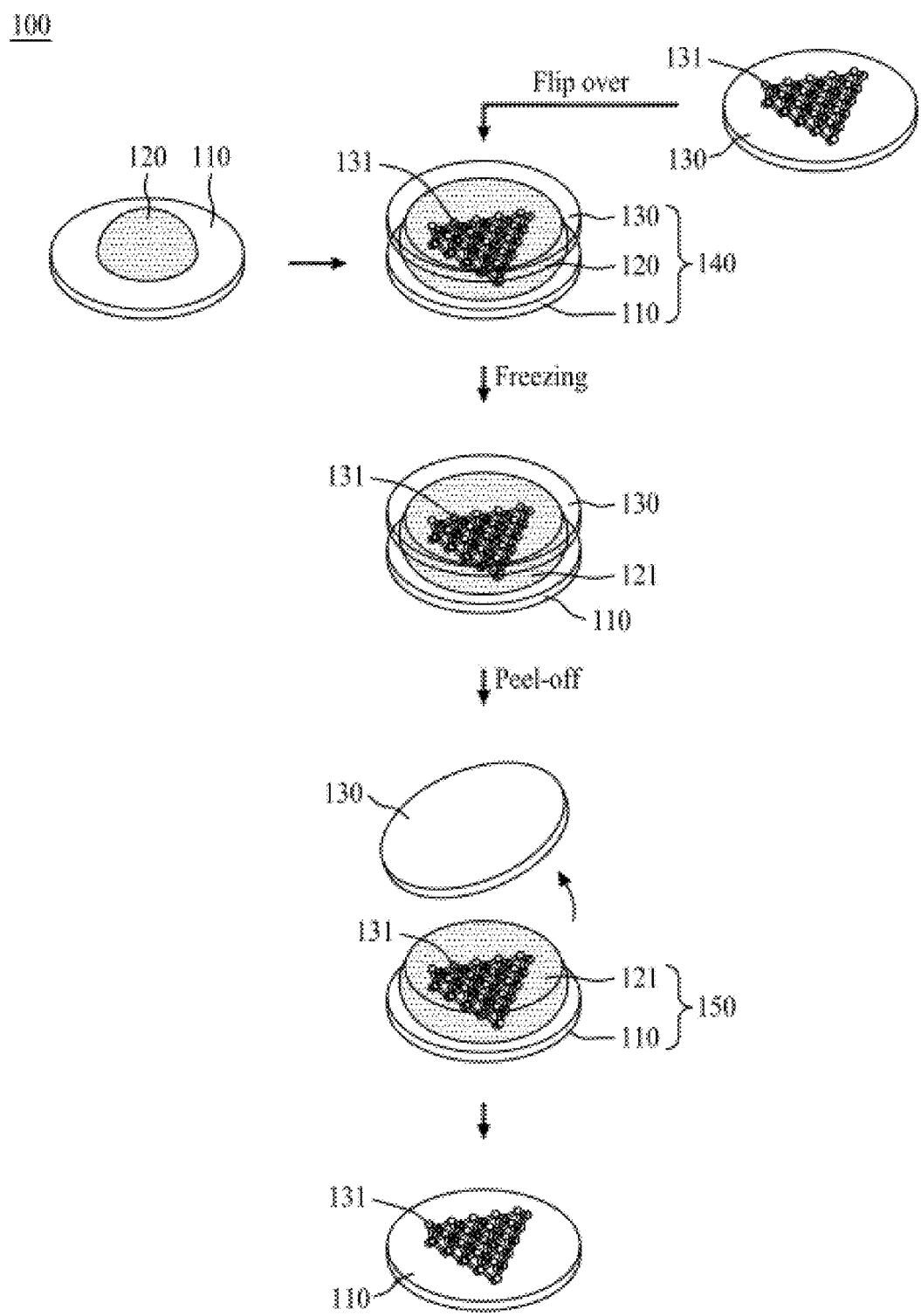
FIGS. 1A and 1B are respectively a schematic diagram and a flowchart depicting steps of the present IAT process 100 in accordance with some preferred embodiments of the present disclosure.

Detailed descriptions and technical contents of the present disclosure are illustrated below in conjunction with the accompanying drawings. However, it is to be understood that the descriptions and the accompanying drawings disclosed herein are merely illustrative and exemplary and not intended to limit the scope of the present disclosure.

Embodiments of the present disclosure include novel methods for transferring 2D atomic layered materials (e.g., graphene, transitional metal dichalcogenide monolayers (TMDs) and etc) from one substrate to another substrate, particularly, form their growth substrate to a target substrate without contamination. Methods in accordance with embodiments of the present disclosure are advantageously simple, easy-to-use, and could specifically transfer 2D materials to a wide range of target substrate.

1. Definition

For convenience, certain terms employed in the context of the present disclosure are collected here. Unless defined otherwise, all technical and scientific terms used herein have the same meaning as commonly understood by one of the ordinary skilled persons in the art to which this invention belongs.

Unless otherwise defined herein, scientific and technical terminologies employed in the present disclosure shall have the meanings that are commonly understood and used by one of ordinary skill in the art. Unless otherwise required by context, it will be understood that singular terms shall include plural forms of the same and plural terms shall include the singular. Specifically, as used herein and in the claims, the singular forms "a" and "an" include the plural reference unless the context clearly indicates otherwise.

As used herein, the term "2D material" refers to a flake or a continuous film of a material formed on a substrate (i.e., a growth substrate) via any methods well known in the related art, the material may be selected from the group consisting of graphene, hexagonal boron nitride (hBN), mxeme, transitional metal dichalcogenide, transitional metal oxide, doubled hydroxide, and a combination thereof. Examples of a continuous film of transitional metal dichalcogenide suitable for use in the present disclosure include, but are not limiting to, MoS$_2$, ReS$_2$, WS$_2$, MoSe$_2$, and ReSe$_2$. In some preferred embodiments, the 2D material is a continuous film of Bi$_2$O$_2$Se. Alternatively, or in addition, the 2D material is a flake of doubled hydroxide (e.g., hydrotalcite).

As used herein, the term "growth substrate" refers to a substrate, on which a flake or a continuous film of a 2D material has been formed via methods well known in the related art, such as chemical vapor deposition (CVD) and the like, and the 2D material formed thereon is intended to be transferred to another substrate, specifically, a target substrate. According to embodiments of the present disclosure, the growth substrate may be made of silicone dioxide, metal, fluorophlogopite (or mica), or sapphire. Examples of the metal suitable for use as a growth substrate include, but are not limiting to, copper (Cu), nickel (Ni), platinum (Pt), or gold (Au). Examples of thermoplastic suitable for use as a growth substrate include, but are not limiting to, polycarbonate (PC), polydimethylsiloxane (PDMS), polyethylene (PE), poly(ethylene terephthalate) (PET), polypropylene (PP), polyvinylchloride (PVC), poly(methyl methacrylate) (PMMA), polystyrene (PS), or epoxy resin. According to some embodiments of the present disclosure, the growth substrate is a mica or is made of fluorophlogopite. According to other embodiments of the present disclosure, the growth substrate is made of PET.

The term "target substrate" as used herein refers to a blank substrate designated to receive a flake or a continuous film of a 2D material transferred from a growth substrate. According to embodiments of the present disclosure, the target substrate may be made of one or more material selected from the group consisting of, carbon, silicone dioxide, glass, ceramic, metal, fluorophlogopite (or mica), sapphire, thermoplastic, and a combination thereof. Examples of the metal suitable for use as a target substrate include, but are not limiting to, copper (Cu), nickel (Ni), platinum (Pt), or gold (Au). Examples of thermoplastic suitable for use as a target substrate include, but are not limiting to, polycarbonate (PC), polydimethylsiloxane (PDMS), polyethylene (PE), poly(ethylene terephthalate) (PET), polypropylene (PP), polyvinylchloride (PVC), poly (methyl methacrylate) (PMMA), polystyrene (PS), or epoxy resin. According to preferred embodiments of the present disclosure, the target substrate is made of silicone dioxide. Additionally or alternatively, the target substrate may be a device consisting of multiple layers of materials, such as a transmission electron microscopy (TEM) grid that consists of, from top to bottom, a layer of carbon, a layer of plastic (or a formvar), and a layer of a copper with a mesh size about 3 mm. According to one preferred embodiment, the target substrate is a TEM grid.

As used herein, the term "supporting substrate" refers to a blank substrate to used in the present IST process for holding an ice layer during mechanical detachment step. Accordingly, the supporting substrate is not the final designated substrate for receiving any material transferred from a growth substrate. According to embodiments of the present disclosure, the supporting substrate is preferably made of the same material of the growth substrate.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about"

means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques.

2. Transfer of 2D Materials (i) Ice-Aided Transfer (IAT) Process

Figure 1B:
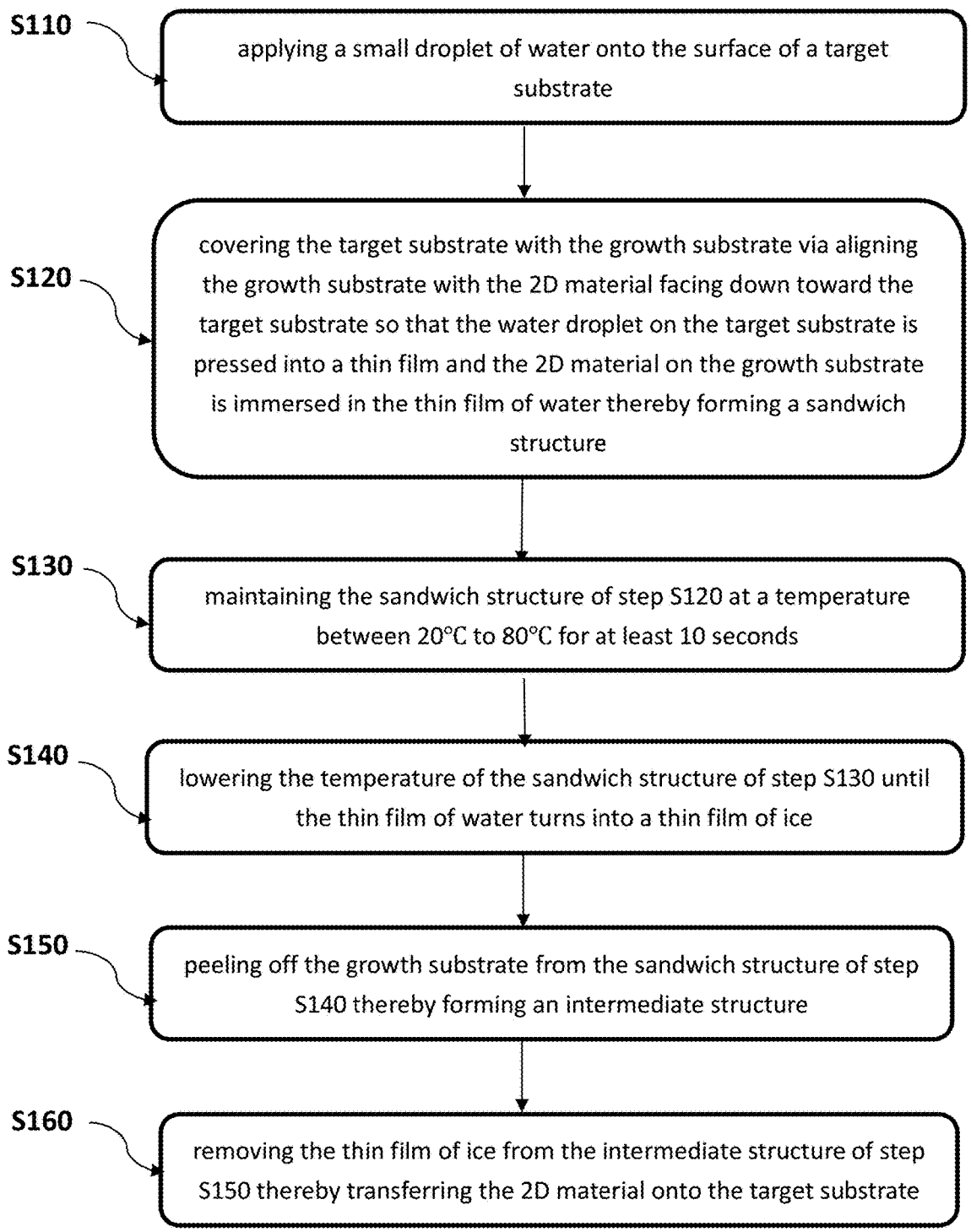

Referring to FIGS. 1A and 1B, which are respectively a schematic diagram and a flowchart depicting steps of the present ice-aided transfer (IAT) process 100 for transferring 2D material from one substrate to another, or from a growth substrate to a target substrate. The 2D material intended to be transferred may be a flake or a continuous film of material formed on a substrate (hereafter "a growth substrate") via any method known in the art (e.g., chemical vapor deposition (CVD) and the like). The present IAT process 100 commences by applying a small droplet of water 120 onto the surface of a blank or target substrate 110, which is a substrate without any 2D material formed thereon and is designated to receive the transferred materials (S110). The target substrate 110 is then covered with the growth substrate 130 by placing the growth substrate 130 on top of the target substrate 110 in the manner that the 2D material 131 is facing the target substrate 110 and slightly pressing down so that the water droplet 120 on the target substrate 110 is pressed into a thin film of water and the 2D material 131 of the growth substrate 130 is immersed in the thin film of water 120 thereby forming a sandwich structure 140 (S120). According to embodiments of the present disclosure, preferably, the thin film of water in the sandwich structure has a thickness of 20 to 200 µm, such as 20, 30, 40, 50, 60, 70, 80, 90, 100, 110, 120, 130, 140, 50, 160, 170, 180, 190, or 200 µm; more preferably, the thin film of water has a thickness of 50 to 180 µm, such as 50, 60, 70, 80, 90, 100, 110, 120, 130, 140, 50, 160, 170, or 180 µm; most preferably, the thin film of water has a thickness of 130 µm.

The sandwich structure 140 is first maintained at an initial temperature between 20° C. to 80° C. for at least 10 seconds (S130), such as at the temperature of 20, 30, 40, 50, 60, 70, or 80° C. for at least 10 seconds; more preferably, the sandwich structure is maintained at 60° C. for at least 1 minute. Then, the initial temperature of the sandwich structure 140 is decreased to a level that eventually turns the thin film of water into a thin film of ice 121 (S140). Preferably, the initial temperature of the sandwich structure 140 is decreased at a rate of 5° C./min until it reaches a freezing temperature between −10° C. to −30° C., such as −10° C., −11° C., −12° C., −13° C., −14° C., −15° C., −16° C., −17° C., −18° C., −19° C., −20° C., −21° C., −22° C., −23° C., −24° C., −25° C., −26° C., −27° C., −28° C., −29° C. or −30° C.; at which temperature, the thin film of water 120 sandwiched between the growth and target substrates 110, 130 is frozen into a thin film of ice 121, thereby would allow easy peeling-off the growth substrate 130 from the sandwich structure 140 and leaving behind an intermediate structure 150 (S150). Note that the intermediate structure 150 is a two-layered structure consisting of the target substrate 110 and the thin film of ice 121, in which the thin film of ice 121 is disposed on top of the target substrate 110 with the 2D material 131 originally formed on the growth substrate 130 being frozen therein. According to embodiments of the present disclosure, almost no sample may be successfully transferred when the freezing temperature is higher than −10° C.; about 40% of samples may be transferred when the freezing temperature is about −15° C.; and almost all samples may be successfully transferred when the freezing temperature is decreased to −20° C. Accordingly, the initial temperature of the sandwich structure 140 is preferably decreased to the freezing temperature between −15 to −25° C., such as about −15° C., −16° C., −17° C., −18° C., −19° C., −20° C., −21° C., −22° C., −23° C., −24° C., or −25° C.; and most preferably, the freezing temperature is about −20° C.

Finally, the thin film of ice 121 is removed from the intermediate structure 150 via natural thawing, heating or freeze-drying thereby transferring the 2D material 131 onto the target substrate 110 (S160).

(ii) Ice Stamp Transfer (IST) Process

The present IAT method may transfer 2D materials onto a wide range of substrates, however, with regard to hydrophobic substrates (e.g., PET substrates or TEM grids), the adhesion of these target substrates with ice layer is not sufficient to hold the ice layer during the mechanical detachment step (i.e., the peeling-off of growth substrate from the sandwich structure in the IAT method described above in FIG. 1), thus a modified method is developed.

Embodiments of the present disclosure thus also encompass an ice stamp transfer (IST) method for transferring 2D materials to hydrophobic target substrates. The IST method is analogous to the IAT method described above, except an additional substrate (i.e., a supporting substrate) is employed to hold the ice layer during the transfer; accordingly, two, but not one, sandwich structures are formed during the process.

Figure 2A:
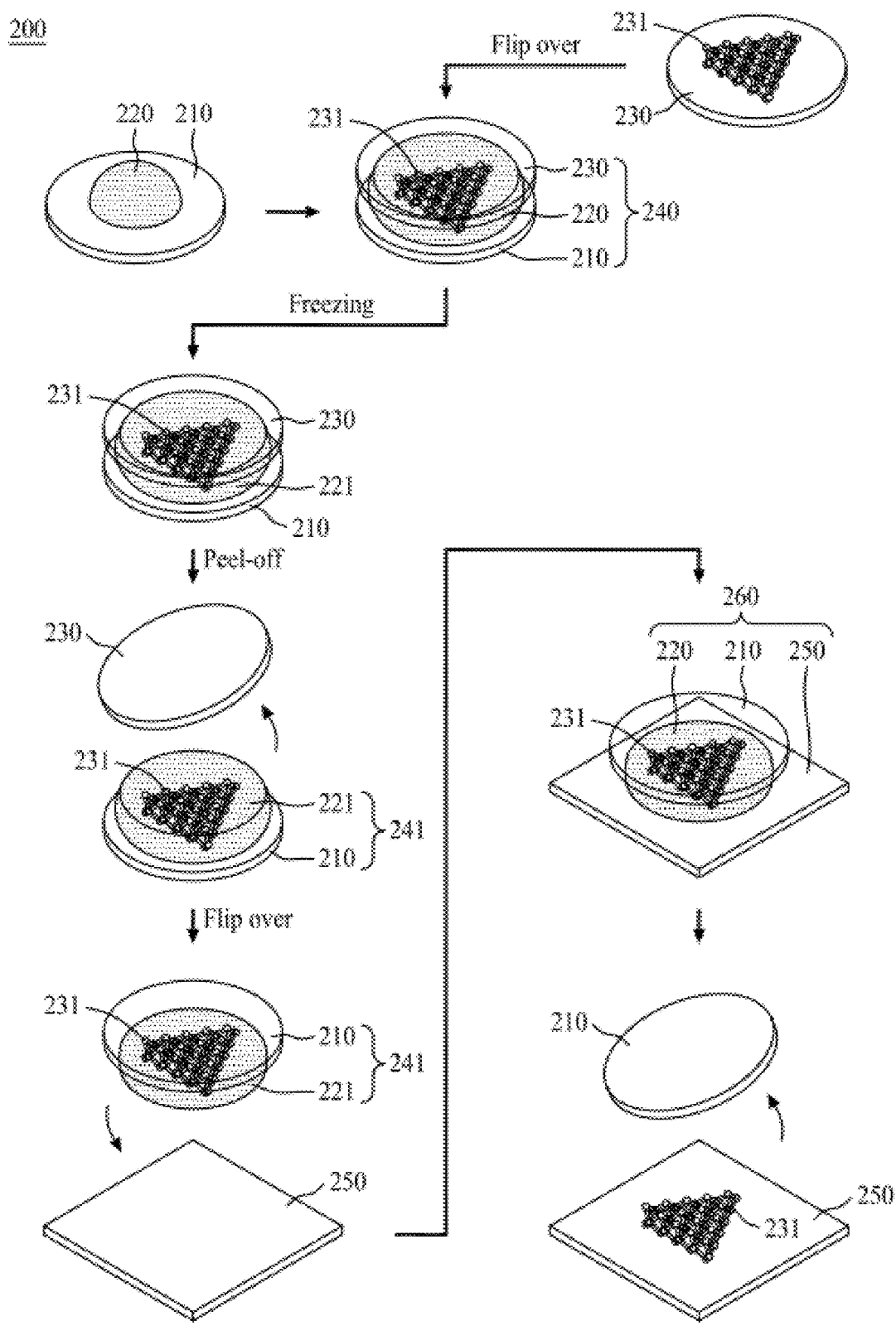
FIGS. 2A and 2B are respectively a schematic diagram and a flowchart depicting steps of the present IST process 200 in accordance with one preferred embodiments of the present disclosure.
Figure 2B:
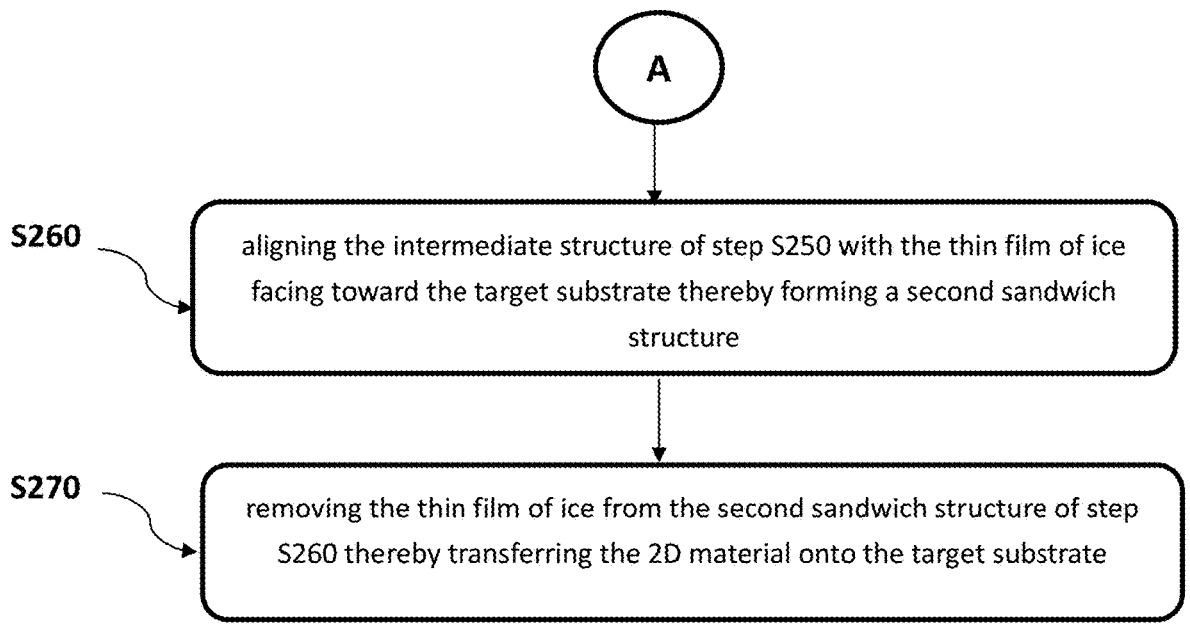

Referring to FIGS. 2A and 2B, which are respectively a schematic diagram and a flowchart depicting steps of the present IST process 200. Similar to the IAT process in FIG. 1, the IST method 200 also starts by applying a droplet of water 220 onto a blank substrate 210 (S210), which is a substrate without any 2D materials formed thereon and is hereafter termed "a supporting substrate 210" for temperately supporting the ice layer until the 2D material is transferred to a real target substrate.

The supporting substrate 210 is then covered with a growth substrate 230, which has a pre-deposited 2D material 231 formed thereon. Specifically, the growth substrate 230 is placed on top of the supporting substrate 210 in the manner that the 2D material 231 is facing the supporting substrate 210 and slightly presses down the growth substrate so that the water droplet on the supporting substrate 210 is pressed into a thin film of water 220 and the 2D material 231 of the growth substrate 230 is immersed in the thin film of water 220, thereby forming a first sandwich structure 240 (S220). According to embodiments of the present disclosure, preferably, the thin film of water 220 in the first sandwich structure 240 has a thickness of 20 to 200 µm, such as 20, 30, 40, 50, 60, 70, 80, 90, 100, 110, 120, 130, 140, 50, 160, 170, 180, 190, or 200 µm; more preferably, the thin film of water 220 has a thickness of 50 to 180 µm, such as 50, 60, 70, 80, 90, 100, 110, 120, 130, 140, 50, 160, 170, or 180 µm; most preferably, the thin film of water 220 has a thickness of 130 µm.

The first sandwich structure 240 is maintained at an initial temperature between 10° C. to 80° C. for at least 30 seconds (S230), such as at the temperature of 20, 30, 40, 50, 60, 70, or 80° C. for at least 10 seconds; more preferably, the first sandwich structure 240 is maintained at 60° C. for at least 1 minute. Then, the initial temperature of the first sandwich structure 240 is decreased until the thin film of water 220 turns into a thin film of ice 221 (S240). Preferably, the initial temperature of the first sandwich structure 240 is decreased at a rate of 5° C./min until it reaches a freezing temperature between −10° C. to −30° C., such as −10° C., −11° C., −12° C., −13° C., −14° C., −15° C., −16° C., −17° C., −18° C., −19° C., −20° C., −21° C., −22° C., −23° C., −24° C., −25° C., −26° C., −27° C., −28° C., −29° C. or −30° C.; at which temperature, the thin film of water 220 sandwiched between the growth and supporting substrates 230, 210 is frozen into a thin film of ice 221. Then, the growth substrate 230 is peeled off from the first sandwich structure 240 thereby forming an intermediate structure 241 (S250). Note that the intermediate structure 241 is a two-layered structure consisting of the supporting substrate 210 and the thin film of ice 221, in which the thin film of ice 221 is disposed on top of the supporting substrate 210 with the 2D material 231 originally formed on the growth substrate 210 being frozen therein. Preferably, the initial temperature of the first sandwich structure 240 is decreased from the initial temperature to the freezing temperature between −15 to −25° C., such as about −15° C., −16° C., −17° C., −18° C., −19° C., −20° C., −21° C., −22° C., −23° C., −24° C., or −25° C.; and most preferably, the freezing temperature is about −20° C.

Then, the intermediate structure 241 is aligned with a target substrate 250 via placing the intermediate structure 241 on top of the target substrate 250 in the manner that the thin film of ice 221 is facing the target substrate 250 thereby forming a second sandwich structure 260 (S260). Finally, the thin film of ice 221 is removed from the second sandwich structure 260 via natural thawing, heating or freeze-drying thereby transferring the 2D material onto the desired target substrate (S270).

Compared with the conventional transfer methods, the IAT or IST samples showed clean and ultra-flat surfaces without noticeable contaminated residues, and the electrical and optical performances of the 2D materials were greatly enhanced.

EXAMPLES

Materials and Methods

Synthesis of $ReS_2$ and $MoS_2$ on Fluorophlogopite Mica and c-Face Sapphire

The synthesis was conducted with a method described previously by Huang et al (J. Am. Chem. Soc. 2020, 142, 13130). The 1 L $ReS_2$ and $MoS_2$ flakes were synthesized in a two-zone tubular furnace. Firstly, 2 mg ammonium perrhenate ($NH_4ReO_4$) powder for $ReS_2$ growth or 2-8 mg sodium molybdate dihydrate ($Na_2MoO_4 \cdot 2H_2O$) for $MoS_2$ growth was placed in a quartz boat and covered by a piece of fluorophlogopite mica ($KMg_3AlSi_3O_{10}F_2$) or c-face sapphire substrate then located at the downstream heating center. Next, 100 mg sulfur plates for $ReS_2$ and $MoS_2$ growth or 100 mg selenium pellets for $ReSe_2$ growth was placed in a separated quartz boat located at upstream heating center. As the down-stream heating center ramped up to 850° C. or 800° C., the up-stream heating center climbed to 200° C. for $ReS_2$ and $MoS_2$ growth, respectively. After maintaining at target temperature for 10 minutes with 80 sccm Argon gas flow, the furnace was cooled down naturally.

Transfer of 2D Materials.

Transfer of $ReS_2$ and $MoS_2$ to $SiO_2$/Si by conventional polymethyl methacrylate (PMMA) method. The as-prepared $ReS_2$ was firstly spin-coated with PMMA (A4). Next, the PMMA/$ReS_2$/substrate was floated on the 75° C. ultrapure water for one hour to detach PMMA/$ReS_2$ from the original substrate. Then, a 300 nm $SiO_2$/Si substrate was applied to pick up the PMMA/$ReS_2$ film. Subsequently, the PMMA/$ReS_2$ on the target substrate was dried under ambient temperature to increase the adhesion between $ReS_2$ and target substrate. Finally, acetone was used to remove the PMMA layer on $SiO_2$/Si substrate, followed by washing with isopropanol and ethanol. The PAT of $MoS_2$ was similar to that of $ReS_2$, except that the $MoS_2$ grown on sapphire substrates were detached from original substrate by using KOH or NaOH solution rather than ultrapure water.

Ice-aided transfer (IAT) of transition metal dichalcogenide monolayers (TMDs). Firstly, a water droplet was put on the target substrate, then the target substrate was covered by the original substrate with 2D sample facing down. Thus, the water droplet was pressed into a thin film sandwiched by the two opposing substrates. Then, the sandwich structure of original substrate-water-target substrate was kept at an initial temperature (60° C.) for 1 min. After a few minutes of freezing, the water film was frozen into ice, establishing a firm coupling between the 2D sample and target substrate. The original substrate was then peeled off from the ice layer and target substrate. Finally, the ice melted and evaporated by heating or freeze drying (specifically for IAT of large-area film sample, the freeze drying was used to avoid the perturbation and tensor strain when ice turns into water), and the 2D sample remained on the target substrate. Specifically, the water film thickness in the sandwich structure ranged from 20 to 200 μm. The cooling rate during freezing process was about 5° C./min. The water used for the ice-aided transfer was ultrapure grade water (produced by Milli-Q). Before use, the water was boiled to further remove the dissolved gas.

Ice-stamp transfer of TMDs. Distinct from the IAT, a hydrophilic substrate (target substrate 1) was applied to detach the ice layer with samples from the original substrate. Then, the target substrate 1 with ice layer and 2D materials was immediately placed on the target substrate 2. After the ice layer melted and water evaporation, the samples were transferred to the target substrate 2.

Ice-Cleaning of 2D Materials

A small amount of water was dropped on the sample. After that the temperature was reduced to −10° C., and the water was frozen into ice. By peeling off the sample from the ice layer, the surface contamination was removed from the sample.

Characterization of Samples after Transfer.

AFM measurement. The topography and phase images were recorded using an AFM5300E system (HITACHI, Japan) in cyclic contact mode by detecting the oscillation evolution of the cantilever. The n-type silicon tip NSG (Tipsnano, Estonia) with Au coating on the reflective side was used in AFM measurement. The RMS of samples was extracted from the AFM topography images. At least 5 different areas were measured for the RMS of each selected sizes, and the areas were selected randomly (but did not overlap) in the images.

Conductive atomic force microscopy (cAFM) measurement. The samples transferred to Si wafer were measured by cAFM. A Rh-coated silicon tip (SI-DF3-R, Hitachi) with a radius approximately of 10 nm was used. The spring constant and resonant frequency of the tip were approximately 1.4 N m$^{-1}$ and 25 kHz, respectively. Measurements were performed with contact mode under constant bias (2 V and 5 V for IAT and PAT sample, respectively) and the compressive force of 1 nN between tip and surface. IV curves were measured from −5 V to 5 V with c-AFM under same conditions.

Raman spectra measurement. Raman spectra of ReS$_2$ was measured using a confocal Raman instrument (Renishaw Raman Spectroscopy 2000, UK) with the excitation wavelength of 633 nm (0.57 mW), the Raman spectra of MoS$_2$ was recorded using the excitation wavelength of 514 nm (0.54 mW) with a grating of 1800 g mm$^{-1}$. The single spectrums were obtained under 50× lens (0.75 N.A.) with a laser spot diameter of ca. 1 µm, while the mapping data was obtained by a 100× lens. The laser power was calibrated by a standard photodiode power sensor S121C (Thorlabs, USA). The laser exposure time for every single spectrum was 10 s.

Field-Effect Transistor (FET) device fabrication and measurement. The FET devices were fabricated with a bottom gate strategy. The samples were transferred on the SiO$_2$/Si wafer with a 300 nm oxide layer. The Cr/Au (5/60 nm) electrodes with a channel length of ~15 µm was directly deposited on the samples via a homemade shadow mask. The device performance was investigated using semiconductor characterization system (Keithley, 4200-SCS) under vacuum condition (10$^{-6}$ Torr) and room temperature. The carrier mobility was decided from the slope of the transfer characteristics in the linear region using the standard equation, $$\mu = \frac{dI_{ds}}{dV_g} \times \frac{L}{W \times C_{SiO_2} \times V_{ds}},$$

where µ is the field-effect mobility, $I_{ds}$ is the drain current, $V_g$ is the gate voltage, L is the channel length, W is the channel width, $V_{ds}$ is the drain voltage, and $CSiO_2$ is the specific capacitance of the dielectric (C=3.9).

SEM and EDS measurement. The morphology of transferred samples was directly observed using scanning electron microscopy (Thermo Scientific™, Quattro ESEM). During morphology observation, a low working voltage (5-10 kV) was applied to avoid the damage of samples. In EDS measurement, a relatively high voltage (20 kV) was applied to obtain the EDS signal.

UV-vis spectra measurement. The UV-vis spectrums of MoS$_2$ on PET were measured using UV-VIS spectrophotometer (PE Lamda 1050).

Calculation of the transfer yield. The image processing software Image J was used to convert OM images of samples on original substrate to 8-bit grayscale images and a rectangular area (1800×1350 µm) of interest was selected for characterization. Then the sample was extracted by adjusting the color threshold, and the total sample area was calculated following a procedure developed by Abramoff et al (Biophotonics Int. 2004, 11, 36). The transfer yield could be estimated by the total sample area on the original substrates before and after transfer. At least three locations were selected for the calculation of transfer yield of each sample.

Contact Angle Measurement

The water contact angle was measured on the SDC-200s contact angle meter at room temperature with 5 µL ultrapure water. The contact angle was analyzed and determined by the software with the equipment.

The Young-Dupre Equation

According to the Young equation, $$\gamma_{w,s} + \gamma_w \cos \theta = \gamma_s \tag{1}$$

where $\gamma_s$, $\gamma_w$, and $\gamma_{w,s}$ refer to the surface energy of water, surface energy of solid substrate, and the interfacial energy between water and substrate. When the water was frozen into ice, the adhesion between ice and substrate could be defined as $$W_a = \gamma_s + \gamma_i - \gamma_{i,s} \tag{2}$$

where $\gamma_i$ and $\gamma_{i,s}$ are the surface energy of ice and the interfacial energy between ice and substrate, respectively. Since the surface energy of water and ice are approximately equal, and assuming that their interfacial energies at the substrate interface are close, equation (1) and (2) can give:

$$W_a \approx \gamma_w (1 + \cos \theta) \tag{3}$$

Equation (3) qualitatively shows that the adhesion between ice and solid substrate increase with lower contact angle (more hydrophilic).

Example 1 Transfer of 2D Material by IAT Process 1.1 Transfer of ReS$_2$ or MoS$_2$ Flakes In this example, transferring of 2D material (i.e., ReS$_2$ or MoS$_2$ flakes) from one substrate to another substrate with the aid of the present IAT method was investigated. To this purpose, mica and sapphire substrates (or growth substrates) respectively deposited with ReS$_2$ and MoS$_2$ flakes were independently subjected to material transferring with the aid of the conventional PMMA method or the present IAT method in accordance with procedures described in the "Materials and methods" section. The sandwich structure was examined by conventional optical microscopy (OM) and atomic force microscopy (AFM). Results are illustrated in FIG. 3.

Figure 3A:
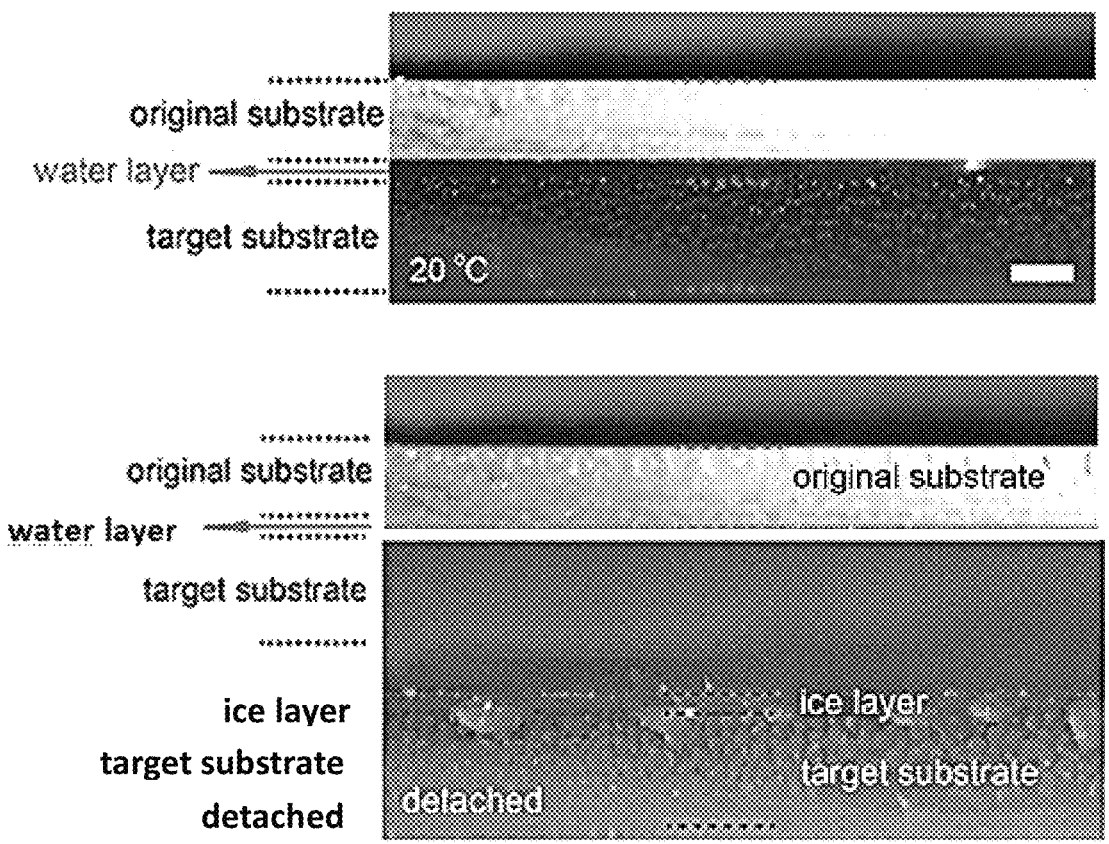
FIGS. 3(a)-(d) are characterization of samples after transfer of 2D materials via IAT method. 3(a) is a Cross-section optical micrographs corresponding to the "attach", "freezing" and "detach" processes. The dash lines highlight the water/ice layer. Scale bar: 500 µm. 3(b, c) The AFM topographic images of $MoS_2$ on ice during ice melting. Scale bars: 20 µm. 3(d) In-situ AFM 3D topographic layouts recorded the reconstruction of ice surface covering with or without $MoS_2$. 3(e) The line profiles taken between the two arrows in 3(d)
Figures 3B, 3C:
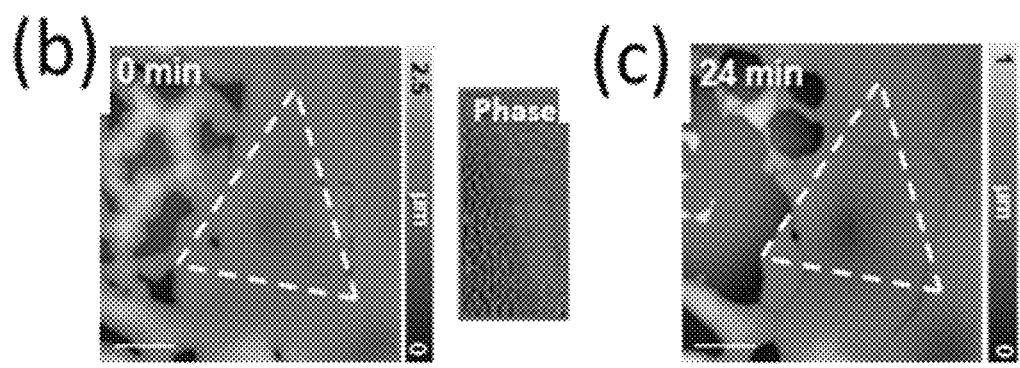
Figure 3D:
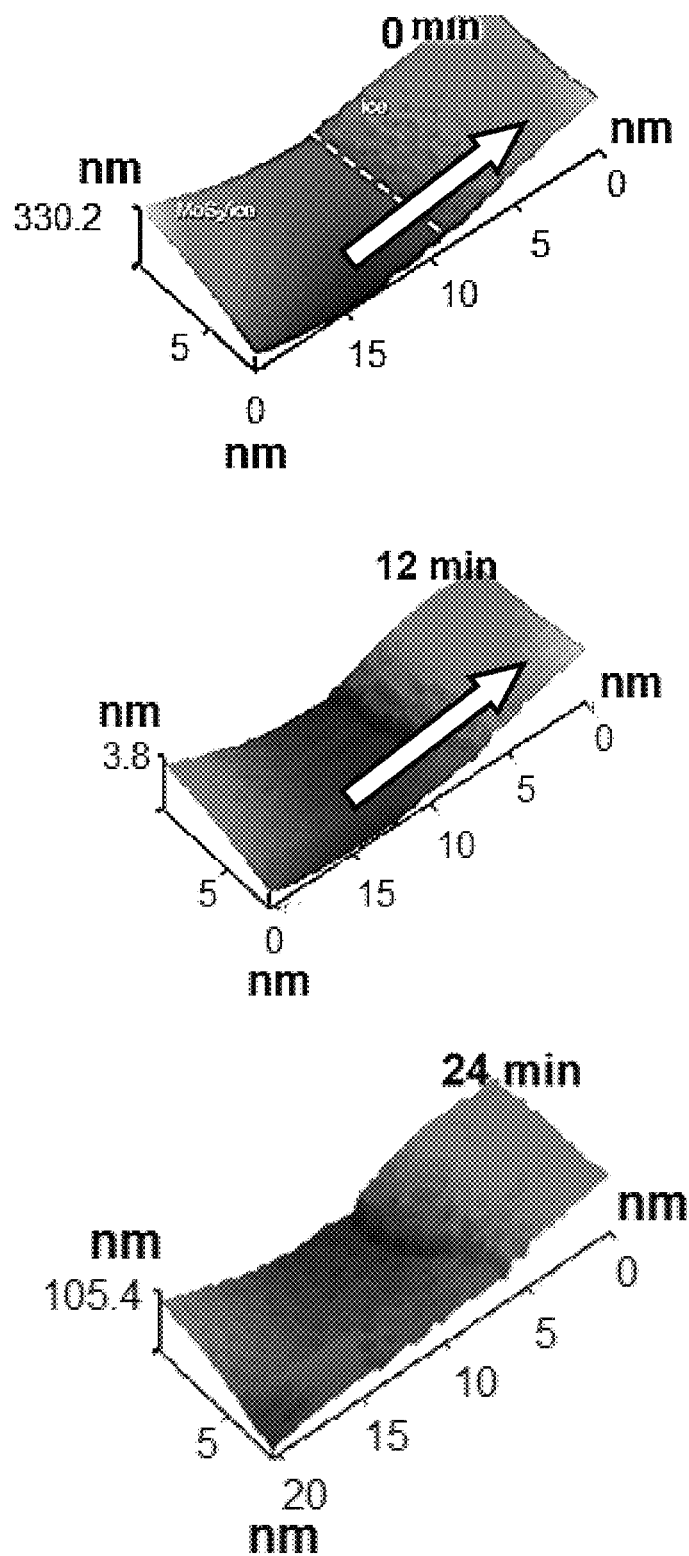
Figure 3E:
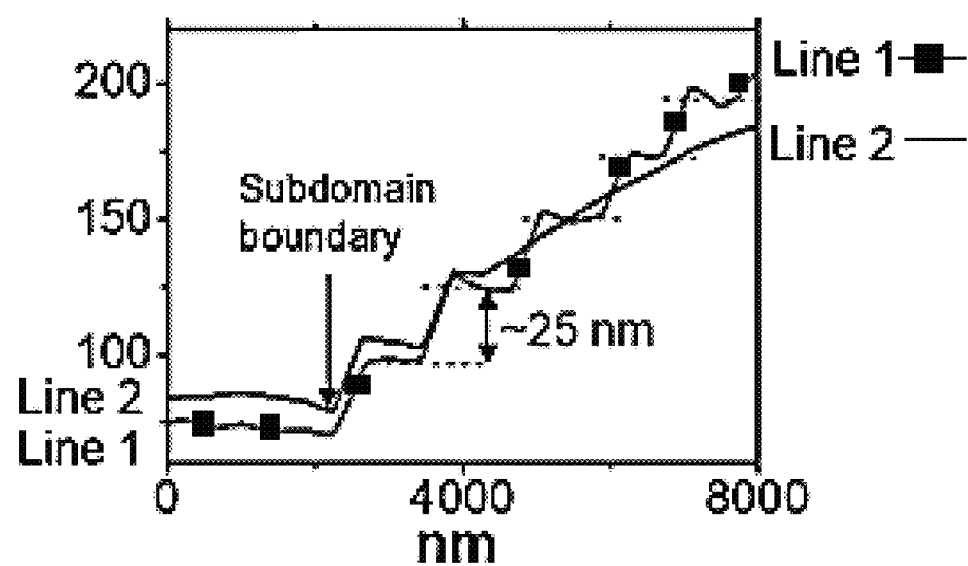

FIG. 3(a) depicts cross-sectional views of the growth substrate-ice (or water)-target substrate sandwich structures captured during transfer of MoS$_2$ by use of IAT method. A water film about 130 µm in thickness was formed between two substrates (FIG. 3(a), left). After freezing, the water film turned into ice, which slightly squeezed out from the interlayer due to volume expansion (FIG. 3(a), middle). After peeling off the original or growth substrate (i.e., sapphire), the ice layer remained on the target substrate (SiO$_2$/Si) (FIG. 3(a), right), and the MoS$_2$ flakes adhered on the ice layer were also observed by the vertical OM system (data not shown).

To gain a deeper insight into the interaction between ice and MoS$_2$, the IAT process was performed inside an environmental-controlled AFM system. After peeling off the original substrate (or the sapphire growth substrate), the AFM chamber was kept at low temperature and N$_2$ atmosphere, and topography test (non-contact mode) was conducted on MoS$_2$ sample adhered to the ice layer. During measurement, it was observed that ice exhibited different melting rates between samples covering with and without MoS$_2$, as a result, the MoS$_2$ flake on the ice layer was located (FIG. 3(b),(c)). The outline of the MoS$_2$ was also confirmed by the corresponding AFM phase image. The successful transfer of MoS$_2$ from growth substrate to ice indicated the strong interaction between ice and MoS$_2$. It has been reported that ordered two-dimensional (2D) ice was formed to maximize the hydrogen bonds at the surface contact with MoS$_2$ in confined space (Bampoulis et al., J. Phys. Chem. C 2016, 120, 27079; Kwac et al., J. Phys. Chem. C 2017, 121, 16021). The high-density hydrogen bonds increased the stability of MoS$_2$—2D ice interface, as evidenced by the AFM topographic image taken at 24 min after detaching of the growth substrate, in which the remaining ice film edge was bound to the edge of MoS$_2$ (FIG. 3, (c)).

Further, once the rigid substrate was detached, the interfacial strain caused by inhomogeneous interfaces between substrate-MoS$_2$-ice and substrate-ice relaxed, and at the same time the confinement space between substrate-MoS$_2$ disappeared, leading to the reconstruction of the ice surface. Upon closer inspections, the time-dependent 3D AFM topographic layouts (FIG. 3(d)) zoomed-in to the edge of MoS$_2$ showed the reconstruction of ice with and without MoS$_2$ covered after the growth substrate was detached. On the uncovered ice, the armchair-like step-edges suggested the epitaxial hexagonal ice was created and was parallel with the edge of MoS$_2$ (FIG. 3(d),(e)). The step-edged structure was the result of lateral strain relaxation and the 2D ice reconstruction/expansion released from the confinement space. As time went by, these step-edges experience coarsening effect with ice sublimation (FIG. 3(e)). On the contrary, the ice covered with MoS$_2$ flake exhibited less fluctuated after removal of growth substrate and remained stable even after 24 min (FIG. 3(d)). The strong interaction between ice and MoS$_2$ stabilized the ice/MoS$_2$ interface, which was essential in IAT or IST process. In addition, the MoS$_2$-ice interaction also affected the crystallinity of ice. The statistical analysis (data not shown) showed the distribution of the angle between adjacent grain boundaries of ice film with the presence of MoS$_2$ (FIG. 3(b)). A prominent peak at around 120° was attributed to hexagonal symmetry structure indicating the crystallization of ice film was correlated with the crystal structure of MoS$_2$.

Taken together, the AFM measurement demonstrated strong interaction between ice and MoS$_2$, indicating that ice could serve as a supporting layer to detach 2D materials from the original growth substrate thereby facilitated the successful transfer of 2D material to the target substrate.

1.2 Characterization of IAT Process

To further optimize the transfer conditions of IAT process, the effects of the wettability of solid surfaces, environmental temperature on IAT process were investigated via monitoring the transfer yield and the morphology of TMD after the transfer.

1.2.1 Substrate

In this example, water contact angles of different substrates were measured and the position of the ice layer after detaching from each pair of substrates was recorded. Results are provided in FIG. 4 and Table 1.

Figure 4:
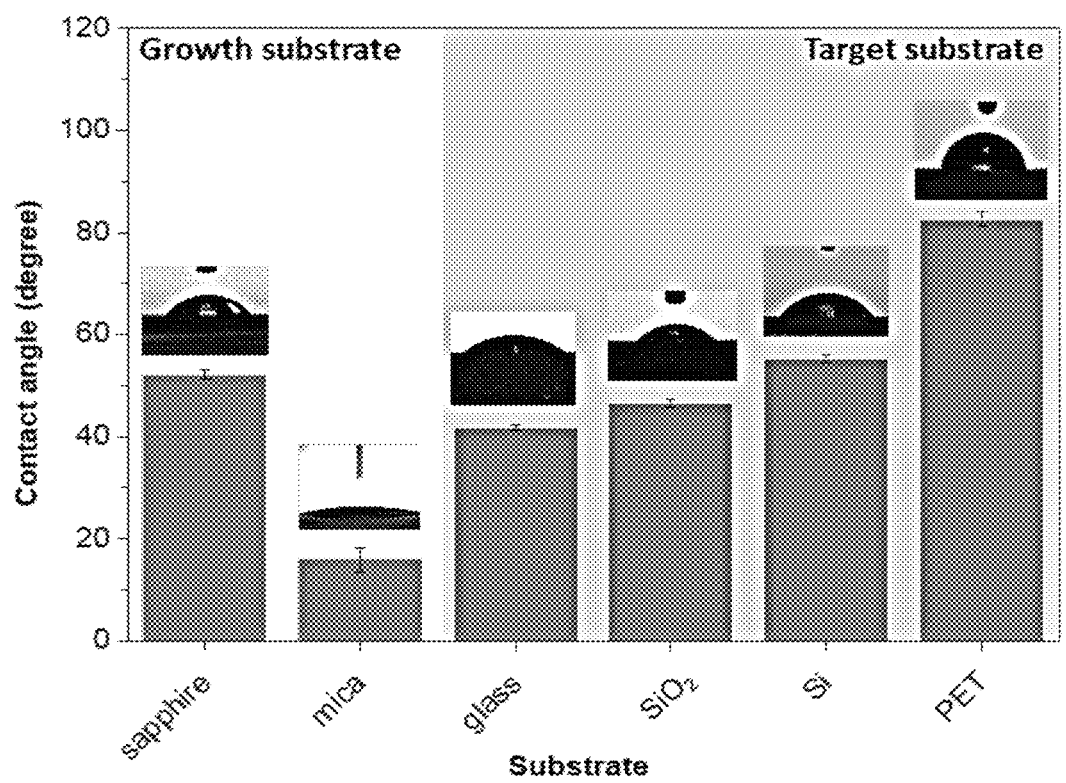
FIG. 4 is a bar graph depicting the water contact angles of different substrates in accordance with one embodiment of the present disclosure.

FIG. 4 depicts the water contact angle on various types of substrates, while table 1 summarizes the position of the ice layer after detaching from each pair of substrates. The data in general showed that substrates with lower water contact angles (namely better wettability) possessed stronger adhesion to ice. These results were in agreement with the Young equation in the form of $W_a \approx \gamma_w(1+\cos\theta)$, where $W_a$ is the adhesion energy, $\gamma_w$ is the surface energy of solid substrate, and $\theta$ is the water contact angle (see the "Materials and Methods" section).

Further, spin-polarized density function theory (DFT) calculations were performed to quantitatively evaluate the binding energy between ice and MoS$_2$, mica, SiO$_2$, respectively (data not shown). By setting the binding energy of ice and mica to zero, the relative binding energy between ice and monolayer MoS$_2$ was −0.41 eV/f.u., significantly larger than the binding energy between MoS$_2$ and mica (−0.22 eV/f.u.), which made it possible to detach MoS$_2$ from mica via ice layer. Further, the binding energy between ice and SiO$_2$ was calculated to be −0.02 eV/f.u., larger than that between ice and mica (0.00 eV), also in agreement with the transfer results in Table 1. The DFT calculation results well demonstrated that ice assisted transfer MoS$_2$ from mica (growth substrate) to SiO$_2$/Si wafer (target substrate). Accordingly, SiO$_2$/Si wafer was chosen as the target substrate for subsequent experiments in this study.

TABLE 1

Position of the ice layer after detaching from each pair of substrates

| Growth substrate (with MoS$_2$) | Target substrate | Position of ice after detach |
|---|---|---|
| mica | SiO$_2$ | SiO$_2$ |
| mica | Glass | Glass |
| mica | Si | Si |
| mica | PET | mica |
| sapphire | SiO$_2$ | SiO$_2$ |
| sapphire | Glass | Glass |
| sapphire | Si | Si |
| sapphire | PET | sapphire |
| SiO$_2$ | Glass | Both |
| SiO$_2$ | Si | SiO$_2$ |
| SiO$_2$ | PET | SiO$_2$ |

1.2.2 Temperature

The effect of temperature (e.g., initial water temperature and freezing temperature) on IAT process was investigated in this example. To this purpose, IAT was performed at different freezing temperatures using either hot (60° C.) or cool water (20° C.) to transfer TMDs (e.g., ReS$_2$, MoS$_2$) formed on different types of growth substrate. Transfer yield in each case was measured. Results are provided in FIG. 5.

Figure 5A:
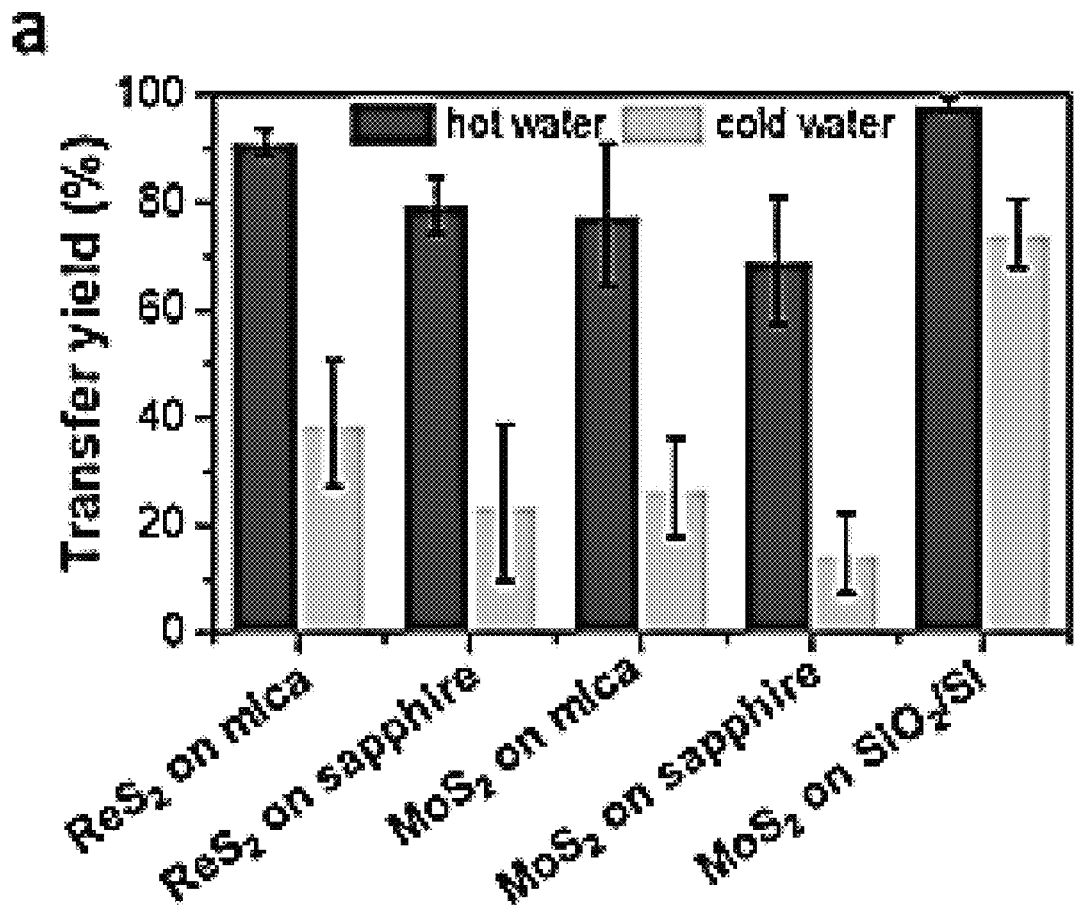
FIGS. 5(a)-(j) are Characterizations of IAT TMDs. 5(a) shows the transfer yields of TMDs from different growth substrates when using hot water (60° C.) or cool water (20° C.) intercalation; 5(b) is the effect of freezing temperature on transfer yield of $ReS_2$ via IAT; 5(c,f) The respective AFM topographic image of (a) PAT flake-like $MoS_2$ and (d) IAT flake-like MoS$_2$. 5(*d,g*) The AFM phase images corresponding to (*c*) and (*d*). 5(*e,h*) The Raman peak distance mapping (A$_{1g}$-E$^1_{2g}$) of PAT MoS$_2$ and IAT MoS$_2$. The scale bars of (*c-h*) are 2 μm. 5(*h*) Comparison of the RMS surface roughness of MoS$_2$ via different transfer methods; and 5(*i*) the PL single spectrums of transferred and original MoS$_2$; 5(*j*) Comparison of the RMS surface roughness of MoS$_2$ via different transfer methods.

FIG. 5(a) depicted the transfer yields of 2D TMDs (mono-layers (1 L)) grown on different substrates using hot water (60° C.) or cool water (20° C.). In each case, the water film was kept at designated temperature for 1 min before freezing, and the final freezing temperature was fixed at −20° C. It turned out using hot water could dramatically increase the transfer yield regardless of the sample types and growth substrates (FIG. 5(a)), and achieved a higher sample intactness (data not shown). The higher transfer yield and intactness were ascribed to the accelerated intercalation by hot water. The water intercalation that occurred at the interface between 2D material and substrate helped reduce the coupling and easy delamination of the 2D samples. Surprisingly, it was also found that MoS$_2$ could be transferred from SiO$_2$ (growth substrate) to SiO$_2$ (target substrate) with a high transfer yield of up to 98%. Further characterization revealed that the SiO$_2$ substrate had a lower water contact angle and higher surface roughness after the high-temperature CVD process (data not shown). The different surface properties may result in the different adhesion to ice and MoS$_2$, hence possible to transfer MoS$_2$ through the same type of SiO$_2$/Si wafer by ice.

Figure 5B:
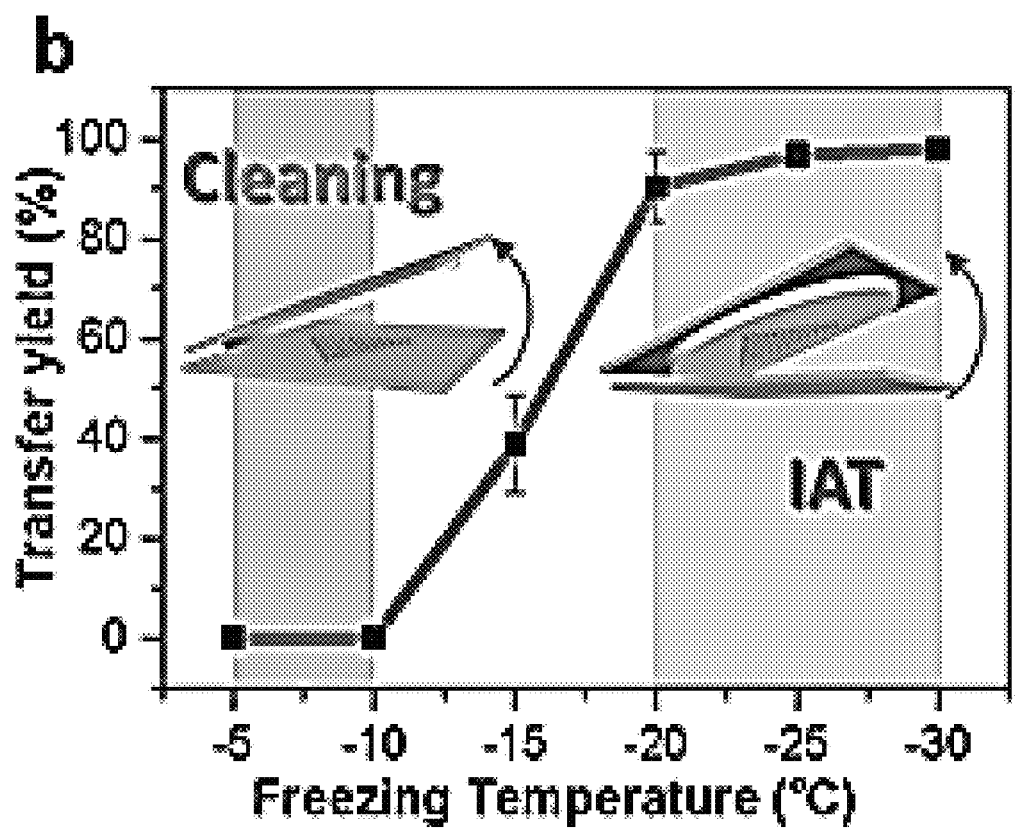

In addition to the water intercalation temperature (initial temperature), the effect of freezing temperature on the adhesion between ice and substrate was also investigated. In this regard, IAT of 2D ReS$_2$ from mica to SiO$_2$/Si was performed under different freezing temperatures. The transfer results are depicted in FIG. 5(b). Almost no sample could be successfully transferred at temperatures higher than −10° C. However, when the temperature decreased to −15° C., nearly 40% of the samples were transferred; when the temperature dropped to −20° C., almost all the samples could be transferred. Notably, although the transfer failed at temperatures above −10° C., in turn it enabled new cleaning approach for 2D materials using ice, which will be discussed in the following part of this paper.

1.2.3 Surface Roughness and/or Cleanliness of TMD after Transfer

Figure 5C:
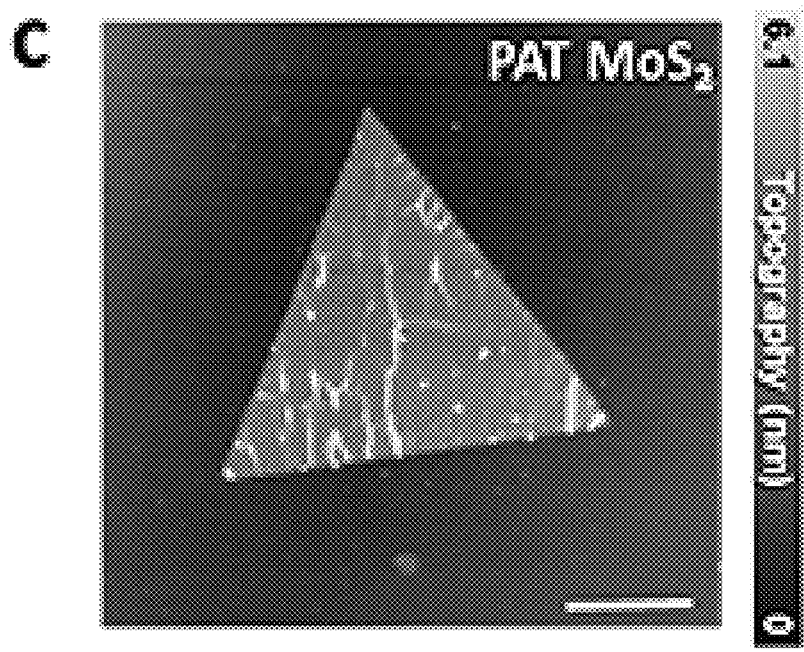
Figure 5D:
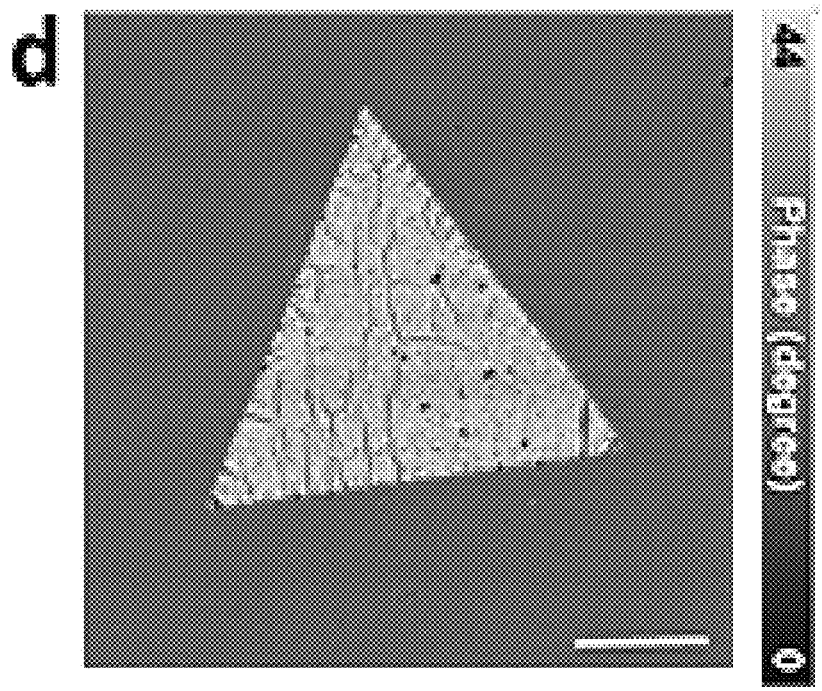

The 2D materials after transfer (i.e., via conventional method or IAT process) were further subjected to AFM analysis. FIG. 5(c) shows the typical AFM topographic image of (1 L) $MoS_2$ by conventional PMMA-aided transfer (PAT). As shown, there were numerous wrinkles present in PAT $MoS_2$ due to the strain arising from both the CVD and transfer process. In contrast, wrinkles were completely absent in 2D $MoS_2$ by IAT (FIG. 5 (f)). The AFM phase images which were sensitive to surface contaminations (FIG. 5(d),(c)) were also collected for all the samples. Compared with PAT samples, IAT samples exhibited high cleanliness on both 2D sample surfaces and substrate surfaces (Note that all IAT samples did not go through further post-treatment such as rinsing or high-temperature annealing after the transfer process). Since water was the only medium used, the transferred samples on target substrates were extremely clean without any notable contamination. In addition to the 2D flake samples, continuous full-film samples could also be successfully transferred via the IAT (data not shown). The large-scale OM images along with the AFM topographic images showed the morphology of full-film $ReS_2$ and $MoS_2$ samples without wrinkles or cracks (data not shown).

Figure 5E:
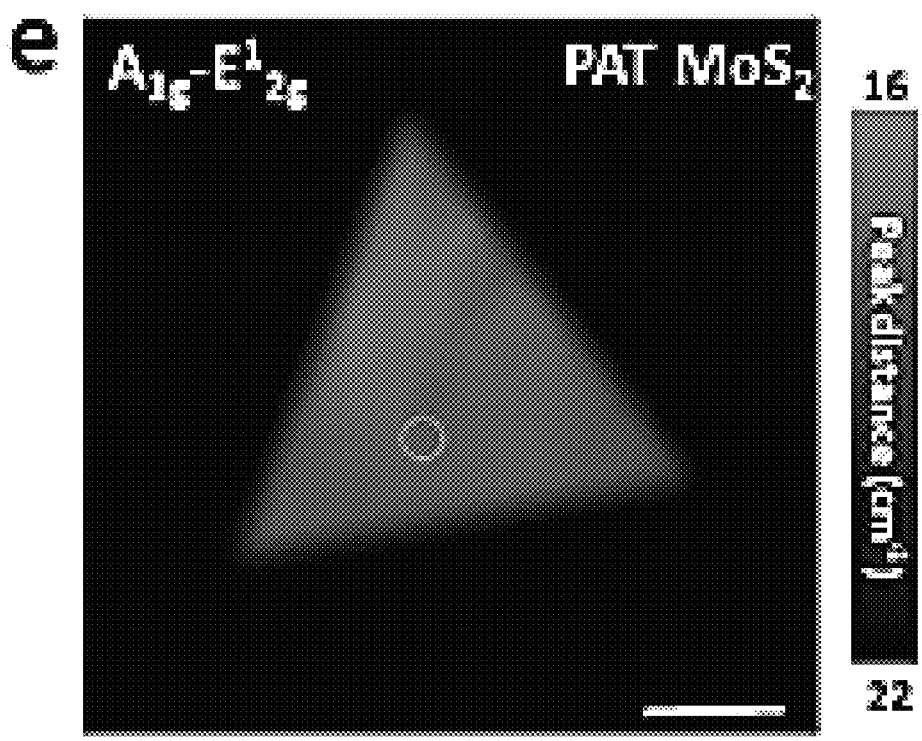
Figure 5F:
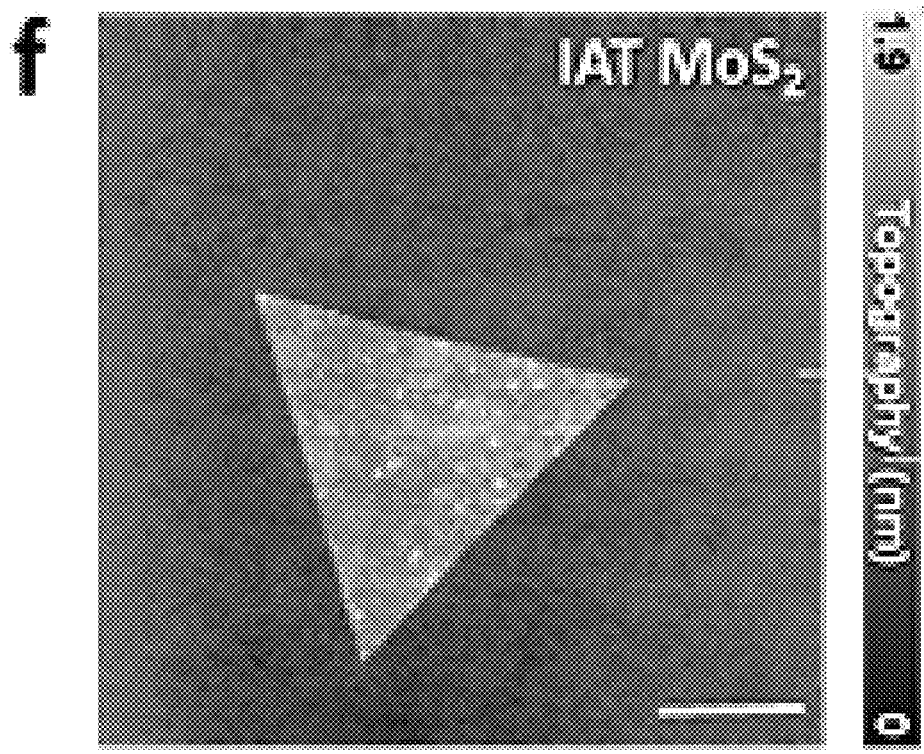
Figure 5G:
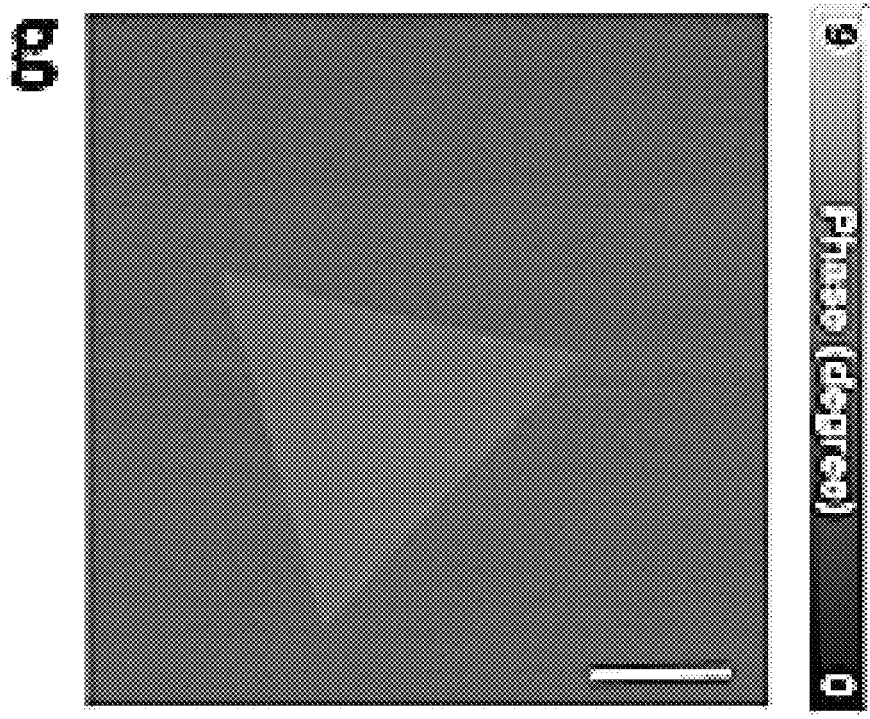
Figure 5H:
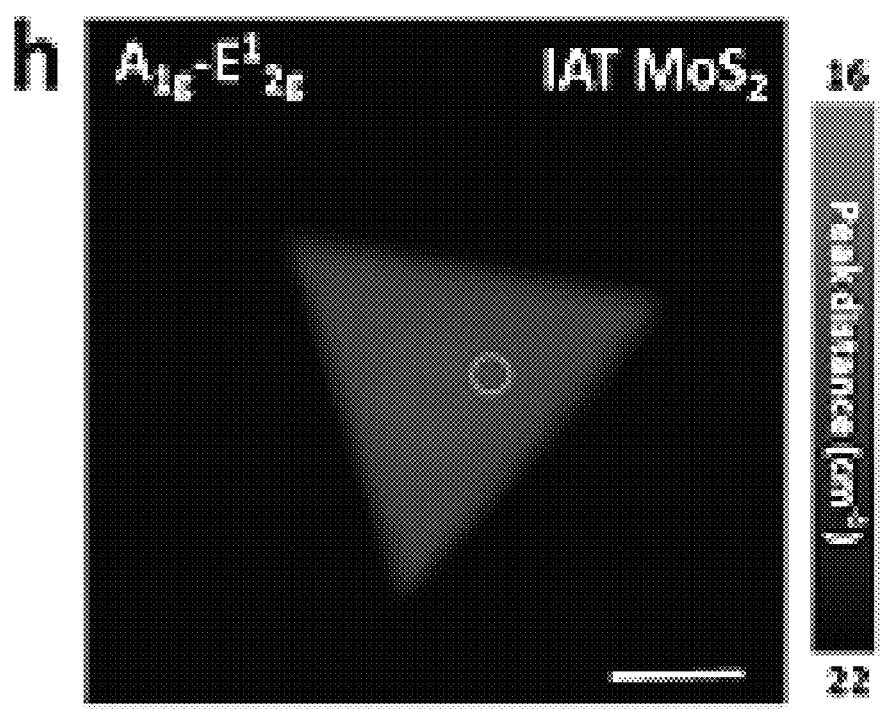
Figure 5I:
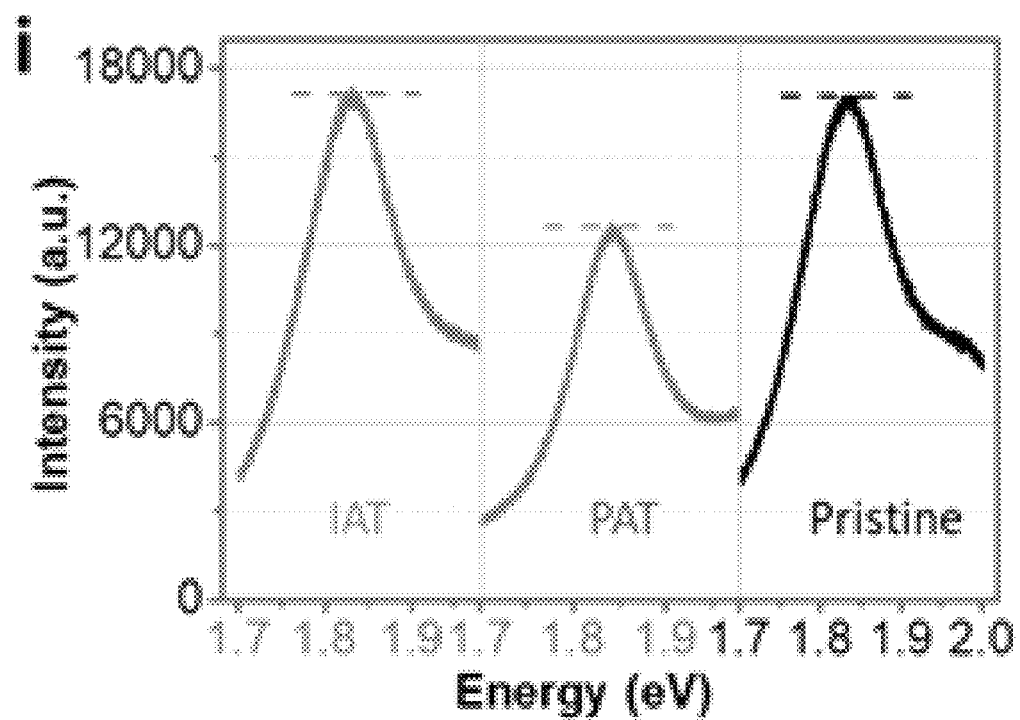
Figure 5J:
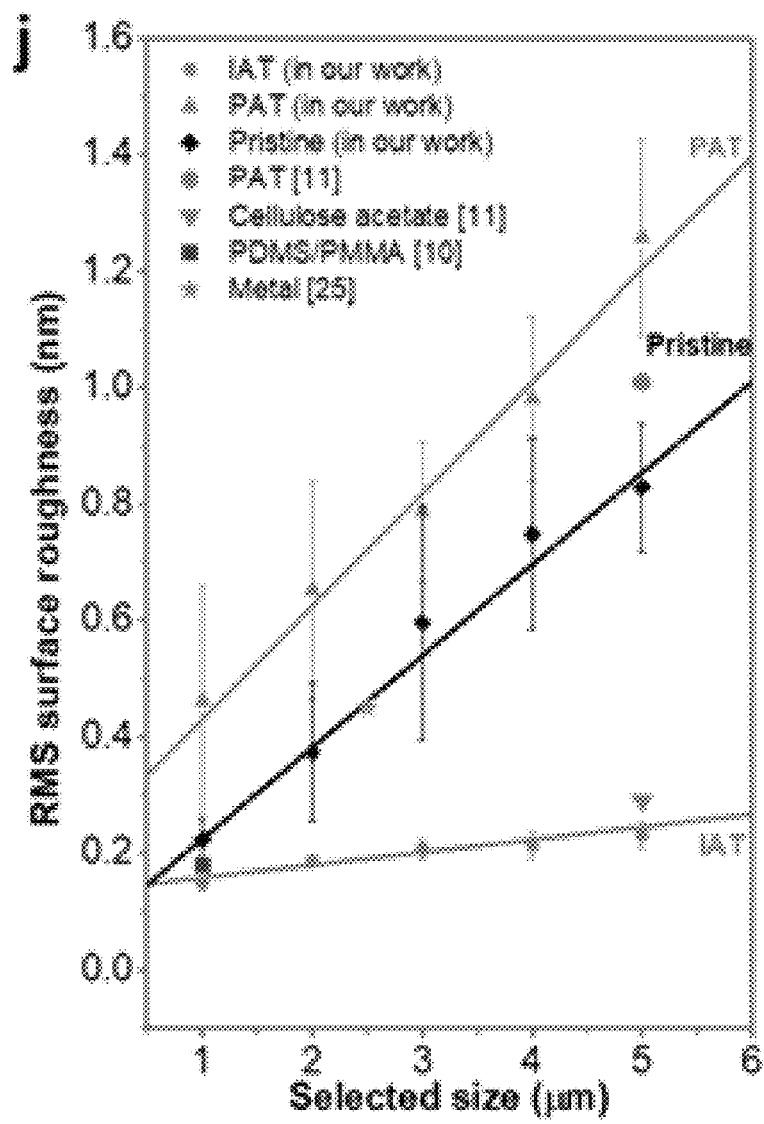

The quality and cleanliness of the transferred samples were quantitatively demonstrated by the Raman mapping (FIG. 5(e),(h)), Root-Mean-Square (RMS) surface roughness (FIG. 5(i)), and energy dispersive spectroscopy (EDS) (data not shown). The Raman peak distance mapping image of IAT $MoS_2$ showed uniform contrast in the sample regions (FIG. 5(h)), indicating its uniform crystal quality. In contrast, the lower uniformity of PAT $MoS_2$ was caused by the ubiquitous wrinkles and polymer residues on surface (FIG. 5(e)). Meanwhile, even though the Raman single spectrums did not show significant difference between IAT and PAT $MoS_2$ (data not shown), the photoluminescence (PL) intensity of PAT $MoS_2$ was significantly lower than that of IAT $MoS_2$ and pristine $MoS_2$ (FIG. 5(i)). The similar PL spectrums of 2D $MoS_2$ before and after IAT implied that no additional defect or doping was induced by IAT process. The RMS surface roughness was calculated from the AFM topographic images with different selected areas. The results indicated that the RMS roughness of 2D $MoS_2$ by IAT was dramatically lowered than that of PAT and pristine $MoS_2$ in both sample and substrate areas (data not shown), and the flatness of 2D $MoS_2$ by IAT also surpassed other reported results using previously described methods, including conventional PDMS/PMMA method described by Wu et al (ACS Nano 2014, 8, 6563), PAT method and cellulose acetate method described by Zhang et al (ACS Appl. Nano Mater. 2019, 2, 5320), and metal method described by Lai et al (RSC Adv. 2016, 6, 57497) (FIG. 5(j)). The carbon element content of EDS measurement showed a similar result (data not shown). Although the carbon contents of IAT and PAT $MoS_2$ were similar in substrate areas, the carbon content in samples area by IAT was significantly lower than PAT.

Taken together, results in this example revealed that the 2D samples by IAT were ultra-clean and smooth, greatly surpassing the quality of that by PAT.

Example 2 Transfer of 2D Materials to Hydrophobic Substrates by IST Process

In addition to $SiO_2$/Si wafer, which was chosen as the target substrate in the present disclosure, we also found that 2D TMDs could be transferred onto different substrates of interest, including glass, Si wafer, PET, and even non-uniform substrates such as TEM grid (data not shown). However, with regard to hydrophobic substrates such as PET and TEM grid, the adhesion of these target substrate was not sufficient to hold the ice layer during mechanical detach. Thus, a modified IAT method—ice stamp transfer (IST) was developed (as shown in FIG. 2). In this method, the ice layer played as a stamp to pick up and carry the 2D materials from original substrate to target substrate, resembling the "PDMS stamp" used in conventional dry transfer.

2.1 Transfer of $MoS_2$ Flakes

In this example, transferring of $MoS_2$ flakes from its growth substrate to a hydrophobic target substrate (i.e., PET) was investigated. Specifically, $SiO_2$ substrates deposited with $MoS_2$ flakes were independently subjected to material transferring with the aid of the conventional PMMA-aided transfer (PAT) method, the present IAT or IST methods in accordance with procedures described in the "Materials and methods" section. The electrical property of 2D material after transfer was examined by conductive atomic force microscopy (cAFM). Results are provided in FIG. 7.

2.1 Electrical and Optical Properties of 2D Materials

Figure 6A:
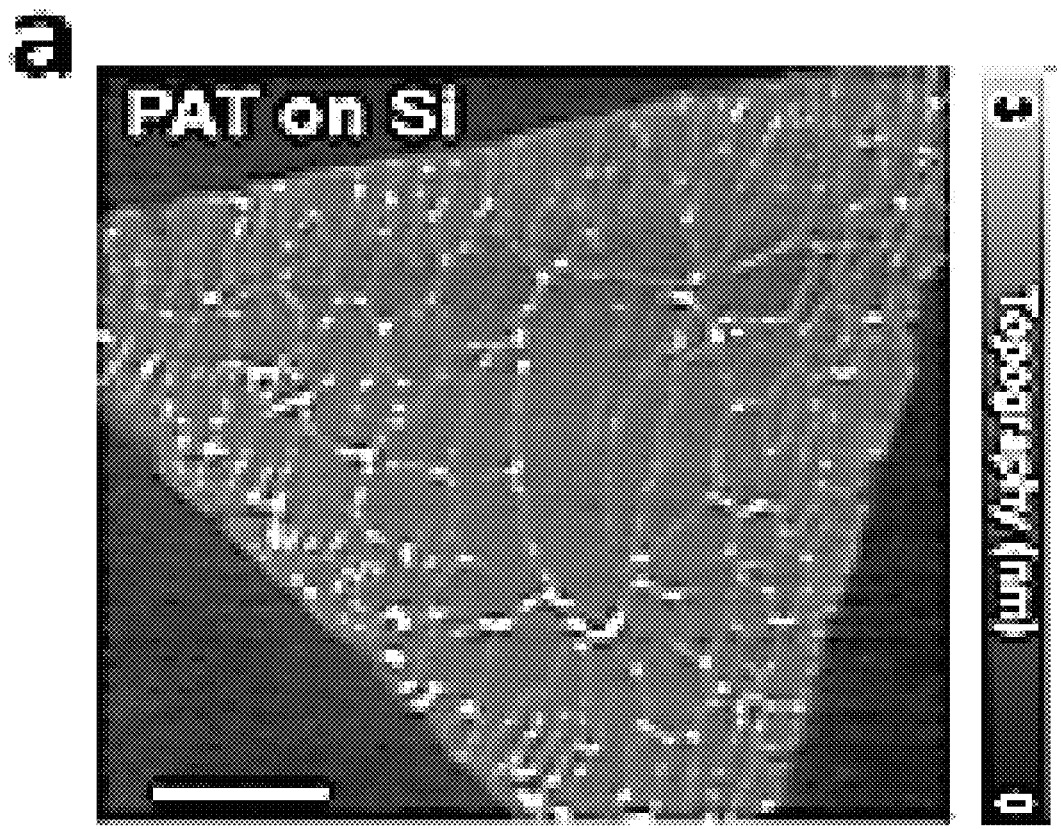
FIG. 6(*a*)-(*j*) are Electrical and Optical Characterizations of IAT MoS$_2$. 6(*a,b*) The AFM topographic images of PAT MoS$_2$ 6(*a*) and IAT MoS$_2$ 6(*b*). Scale bars: 1 μm. 6(*c,d*) The PL intensity mapping of 6(*c*) PAT and 6(*d*) IAT MoS$_2$. Scale bars: 1 μm. 6(*e*) The I-V curves of IAT and PAT MoS$_2$ recorded by cAFM measurement (upper panel) and micro-device measurement (lower panel). 6(*f,g*) AFM topographic images of MoS$_2$ on PET by 6(*f*) PAT and 6(*g*) PAT, respectively. Scale bars: 5 μm. Inset: zoom-in AFM images of the PET substrates. Scale bars: 2 μm. 6(*h,i*) The corresponding PL intensity mapping of 6(*h*) PAT and 6(*i*) IST MoS$_2$. Scale bars: 5 μm. 6(*j*) UV-vis spectrums of MoS$_2$ on PET transferred by ice and PMMA.
Figure 6B:
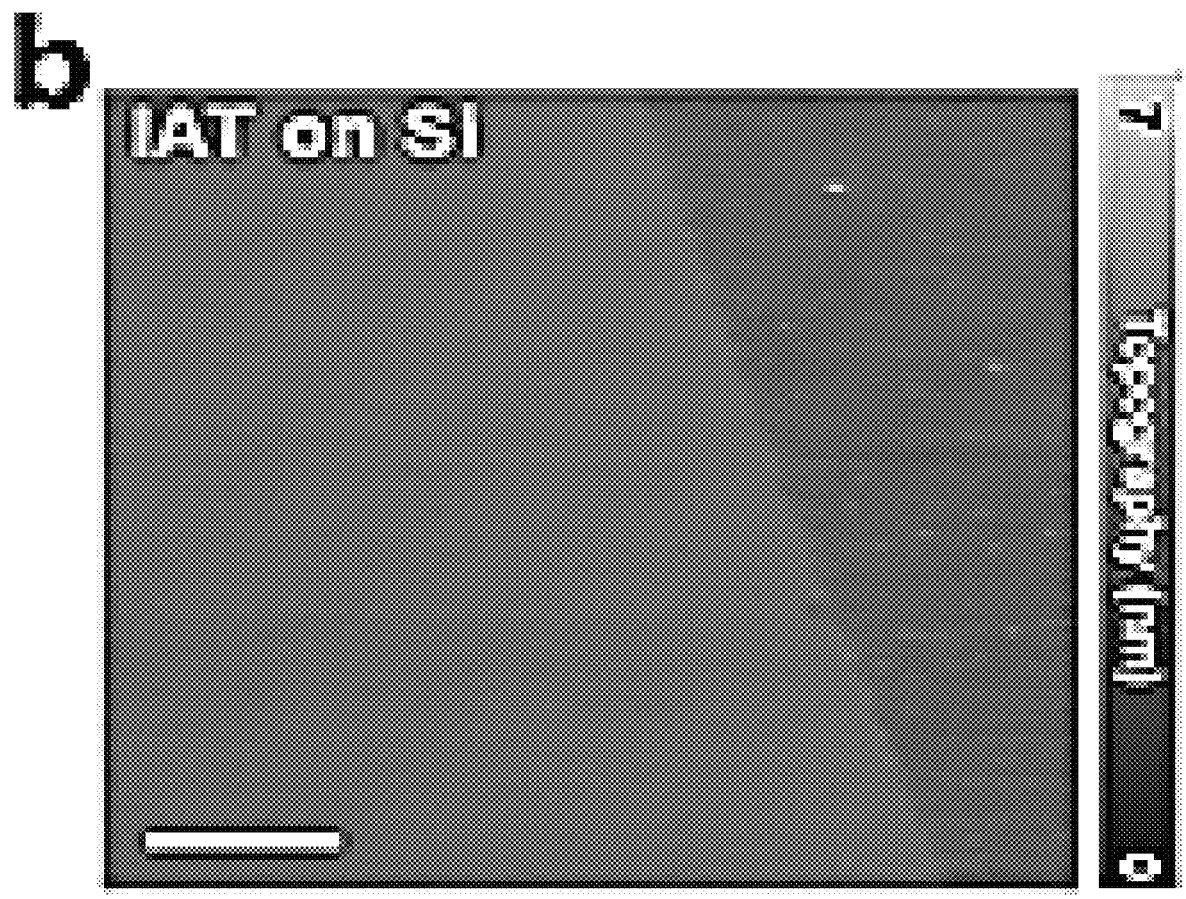
Figure 6C:
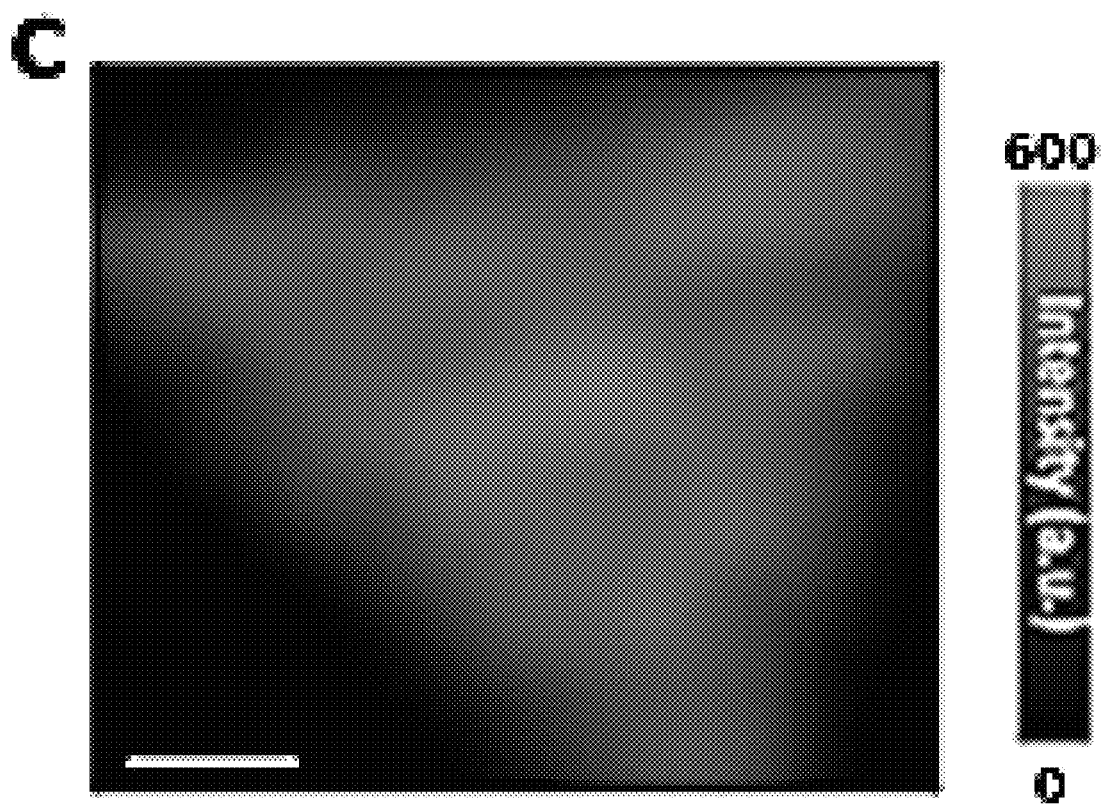
Figure 6D:
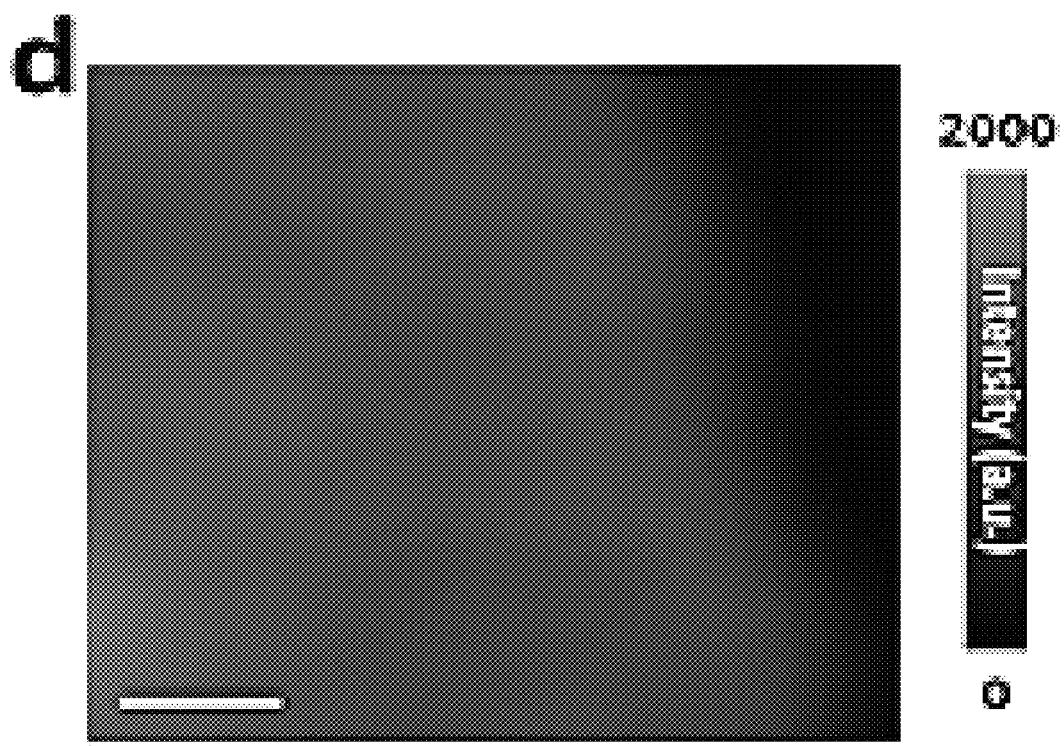
Figure 6E:
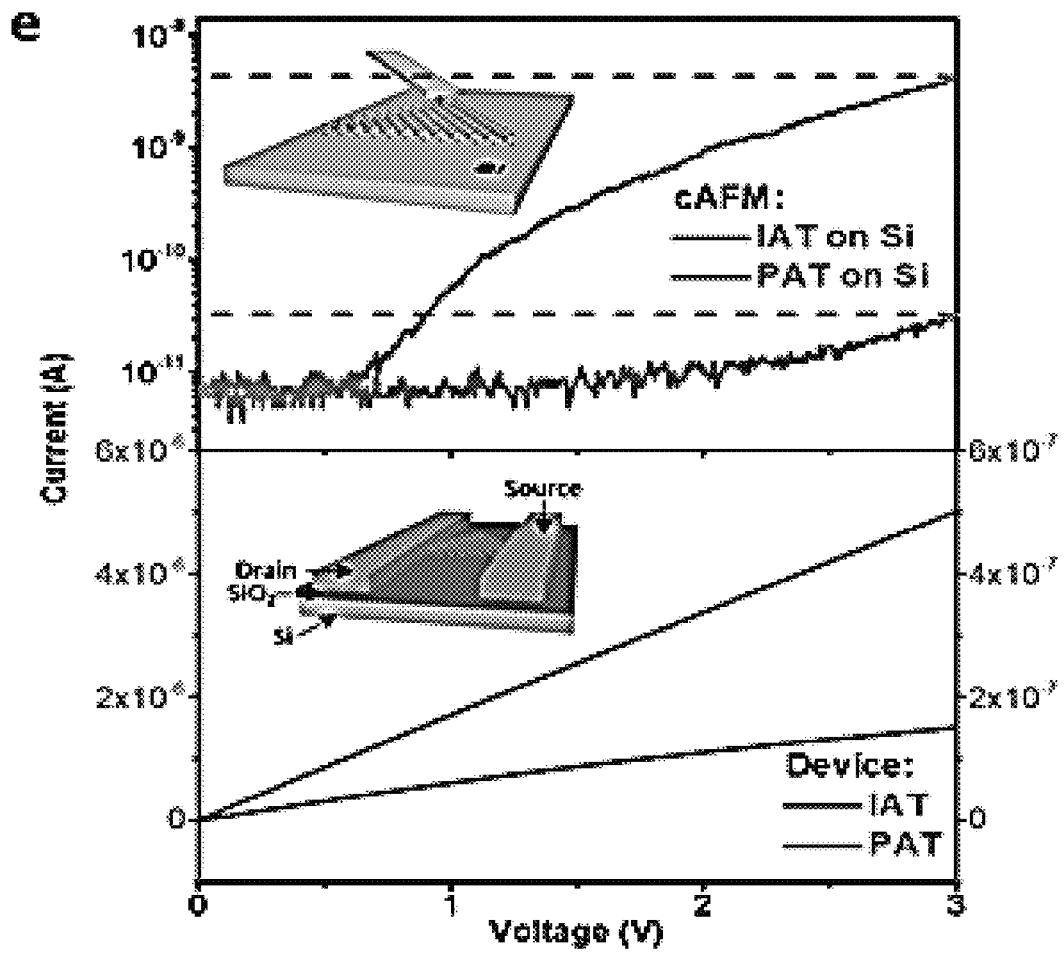

FIGS. 6(a) and 6(b) are the AFM topographic images of 1 L $MoS_2$ by IAT and PAT, respectively. For fair comparison, the $MoS_2$ samples on growth substrate were split into two pieces and transferred by IAT and PAT, respectively. As shown in the PL intensity mapping (FIG. 6(c),(d)), the PL intensity of PAT $MoS_2$ was notably lower than that of IAT $MoS_2$ because the polymer residues strongly undermined the quality of 2D $MoS_2$. The electrical bias was then applied to evaluate the vertical conductivity of these two samples. Surprisingly, as revealed by the cAFM current mapping images (data not shown) and the I-V curve (FIG. 6(e), upper panel), the current on $MoS_2$ by IAT was two orders of magnitude higher than the of PAT samples. The high conductivity could be attributed to the contamination-free surface and 2D sample/substrate interfaces of IAT samples, whereas the PMMA polymer led to scattering centers and potential barriers which increased the contact resistance (Rc) and significantly impair the electrical conductivity of the PAT samples.

The electrical properties of IAT $MoS_2$ were further demonstrated by the field-effect transistor (FET) devices. To avoid the introduction of polymer from the device fabrication process, a homemade shadow mask was used to deposit electrodes rather than using electron-beam lithography. Contact resistance (Rc) dominated the total device resistance particularly when the channel length was scaled down. Consistent with the cAFM result, the IAT $MoS_2$ sample exhibited a much higher current and better linearity compared with PAT $MoS_2$ (FIG. 6(e), lower panel). The transfer curves and I-V curves under different gate voltage of the devices showed the maximum room temperature carrier mobility of the IAT $MoS_2$ reaches 24.3 $cm^2/(V \cdot s)$, averaged was 17.9 $cm^2/(V \cdot s)$, which was comparable to or higher than most of the previously reported similarly-structured $MoS_2$ devices prepared by other transfer methods (Graaslan et al., ACS Nano 2014, 8, 11522; Lee et al., Nano Lett. 2013, 13, 1852; Park et al., ACS Nano 2014, 8, 4961; Radisavljevic et al., Nat. Nanotechnol. 2011, 6, 147; and Shen et al., Adv. Funct. Mater. 2021, 31, 2104978).

Figure 6F:
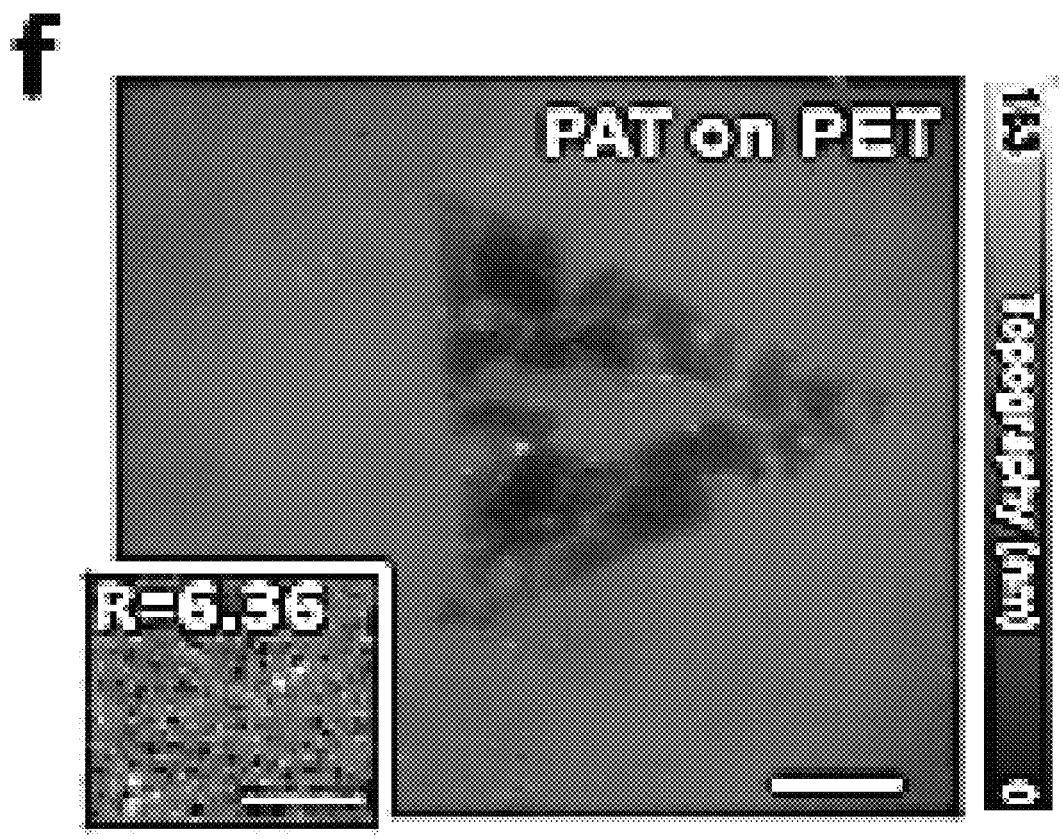
Figure 6G:
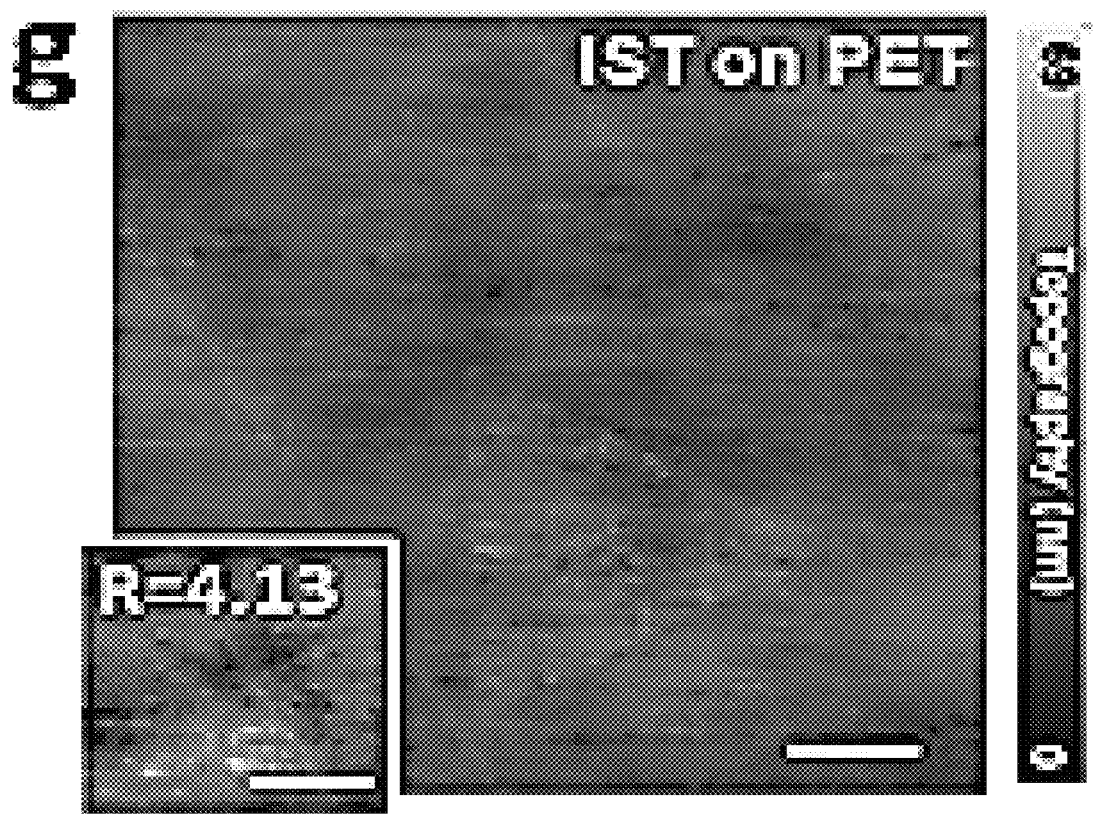
Figure 6H:
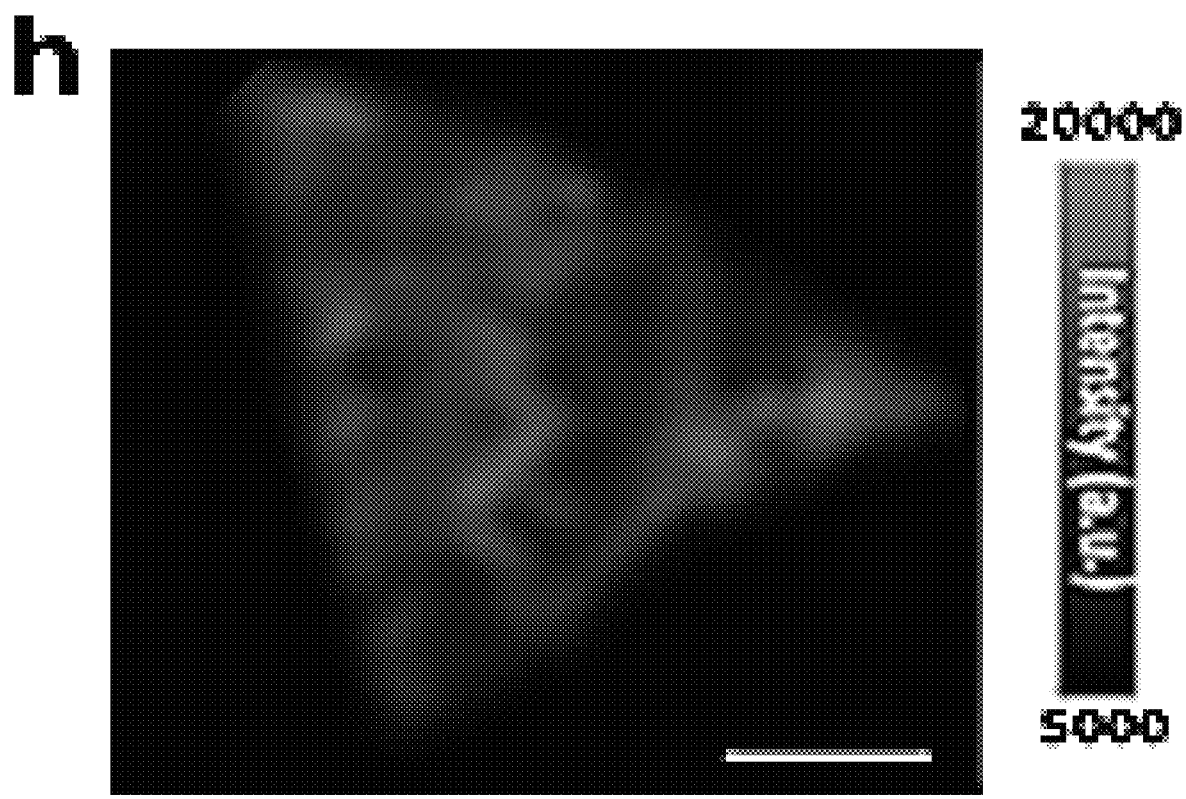
Figure 6I:
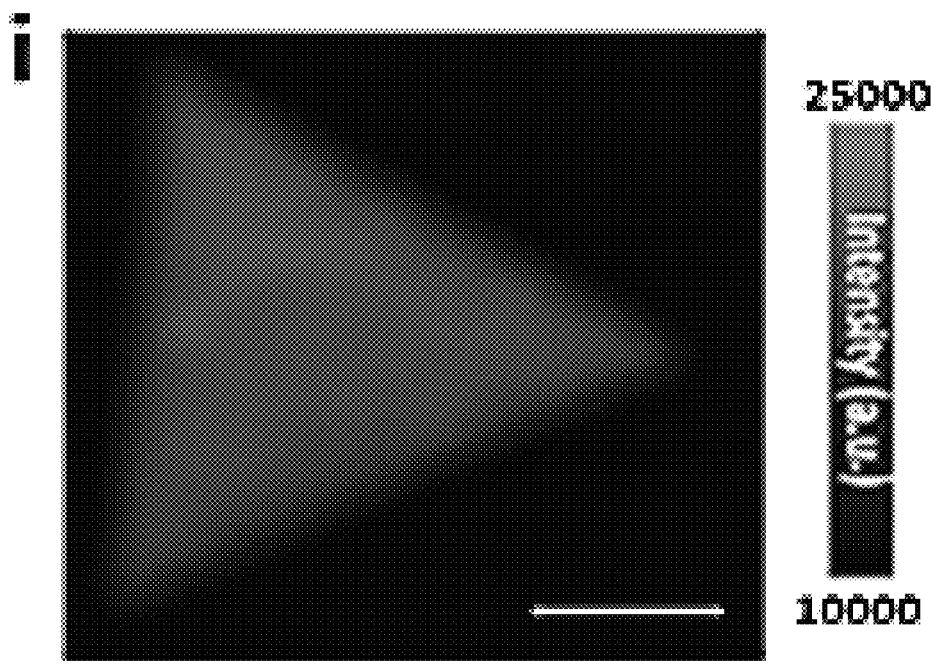
Figure 6J:
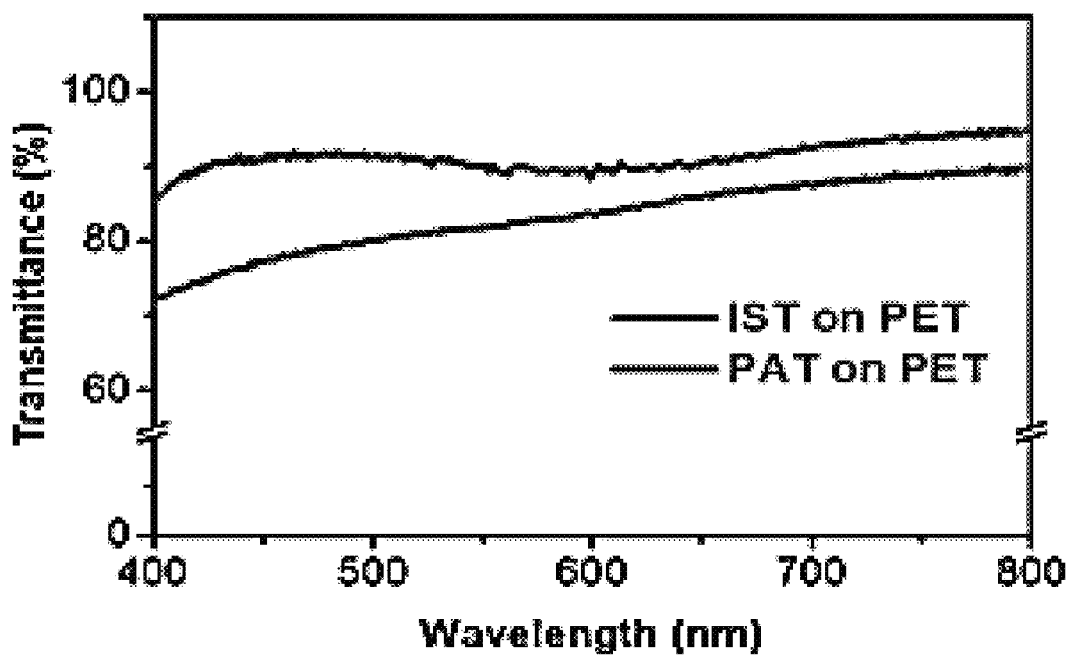

Similar to the MoS$_2$ transferred to Si wafer, the PL intensity mapping of IST MoS$_2$ on PET showed a better uniformity than that of PAT MoS$_2$ (FIG. 6(h),(i)). Further, the UV-vis spectrum showed the transmittance of PAT MoS$_2$/PET was significantly lower than the IST sample (FIG. 6(j)). We ascribed this to the organic solvent involved in the PAT process, which reduced the transparency of the PET substrate. As revealed by the AFM measurement, the PET substrate after PAT showed significantly higher surface roughness (zoom-in areas in FIG. 6(f),(g)). The height of 1L-MoS$_2$ was even lower than the surrounding PET substrate due to the dissolved organic solvent in PET (FIG. 6(f)). The organic solvent, especially acetone, caused swelling effect and damaged the surfaces of polymeric substrates, and therefore, the degradation of optical performances. By contrast, the damage-free IST or IAT methods without using any organic solvent preserved the pristine properties of polymer substrates.

Taken together, the present IST process could greatly expand the application of 2D materials, particularly on organic-solvent sensitive polymeric substrates, which is necessary for flexible electronics and bio- or biomedical engineering.

It will be understood that the above description of embodiments is given by way of example only and that various modifications may be made by those with ordinary skill in the art. The above specification, examples and data provide a complete description of the structure and use of exemplary embodiments of the invention. Although various embodiments of the invention have been described above with a certain degree of particularity, or with reference to one or more individual embodiments, those with ordinary skill in the art could make numerous alterations to the disclosed embodiments without departing from the spirit or scope of the present disclosure.

What is claimed is:

1. A method of transferring a two-dimensional (2D) material formed on a growth substrate to a target substrate comprising:
    (a) applying a water droplet on the target substrate;
    (b) covering the target substrate with the growth substrate via aligning the growth substrate with the 2D material facing down toward the target substrate so that the water droplet on the target substrate is pressed into a thin film and the 2D material on the growth substrate is immersed in the thin film of water thereby forming a sandwich structure;
    (c) maintaining the sandwich structure of step (b) at a temperature between 20° C. to 80° C. for at least 10 seconds;
    (d) lowering the temperature of the sandwich structure of step (c) until the thin film of water turns into a thin film of ice;
    (e) peeling off the growth substrate from the sandwich structure of step (d) thereby forming an intermediate structure; and
    (f) removing the thin film of ice from the intermediate structure of step (e) thereby transferring the 2D material onto the target substrate.

2. The method of claim 1, wherein in step (b), the thin film of water has a thickness of 20 to 200 μm.

3. The method of claim 2, wherein the thin film of water has a thickness of 130 μm, and the sandwich structure is maintained at 60° C. for at least 1 minute.

4. The method of claim 2, wherein in step (d), the temperature of the sandwich structure is lowered at a rate of 5° C./min to −10° C. to −30° C.

5. The method of claim 4, wherein the temperature of the sandwich structure is lowered to −20° C.

6. The method of claim 4, wherein in step (f), the thin film of ice is removed via natural thawing, heating, or freeze-drying.

7. The method of claim 1, wherein the 2D material is a flake or a continuous film of graphene, hexagonal boron nitride (hBN), MXene, transitional metal dichalcogenide, transitional metal oxide, or doubled hydroxide.

8. The method of claim 7, wherein,
    the continuous film of transitional metal dichalcogenide is selected from the group consisting of MoS$_2$, ReS$_2$, WS$_2$, MoSe$_2$, and ReSe$_2$;
    the continuous film of transitional metal oxide is Bi$_2$O$_2$Se; and
    the flake of doubled hydroxide is hydrotalcite.

9. The method of claim 1, wherein,
    the growth substrate is made of one or more material selected from the group consisting of silicon dioxide, metal, fluorophlogopite, sapphire and a combination thereof; and
    the target substrate is made of one or more material selected from the group consisting of carbon, silicon dioxide, glass, ceramic, metal, fluorophlogopite, sapphire, thermoplastic, and a combination thereof.

10. The method of claim 9, wherein
    the growth substrate or the target substrate is made of the metal, which is copper (Cu), nickel (Ni), platinum (Pt), or gold (Au); and
    the thermoplastic is polycarbonate (PC), polydimethylsiloxane (PDMS), polyethylene (PE), poly(ethylene terephthalate) (PET), polypropylene (PP), polyvinylchloride (PVC), poly(methyl methacrylate) (PMMA), polystyrene (PS), or epoxy resin.

11. The method of claim 10, wherein the target substrate is a transmission electron microscopy (TEM) grid consisting of, from top to bottom, a layer of the carbon, a layer of the thermoplastic, and a layer of copper.

12. A method of transferring a 2D material formed on a growth substrate to a target substrate comprising:
    (a) applying a water droplet on a supporting substrate;
    (b) covering the supporting substrate with the growth substrate via aligning the growth substrate with the 2D material facing toward the supporting substrate so that the water droplet on the supporting substrate is pressed into a thin film and the 2D material of the growth substrate is immersed in the thin film of water thereby forming a first sandwich structure;
    (c) maintaining the first sandwich structure at a temperature between 20° C. to 80° C. for at least 10 seconds;
    (d) lowering the temperature of the first sandwich structure of step (c) until the thin film of water turns into a thin film of ice;
    (e) peeling off the growth substrate from the first sandwich structure of step (d) thereby forming an intermediate structure;
    (f) aligning the intermediate structure of step (e) with the thin film of ice facing toward the target substrate thereby forming a second sandwich structure; and
    (g) removing the thin film of ice from the second sandwich structure of step (f) thereby transferring the 2D material onto the target substrate.

13. The method of claim 12, wherein in step (b), the thin film of water has a thickness of 20 to 200 μm.

14. The method of claim 13, wherein the thin film of water has a thickness of 130 μm, and the first sandwich structure is maintained at 60° C. for at least 1 minute.

15. The method of claim 12, wherein in step (d), the temperature of the first sandwich structure is lowered at a rate of 5° C./min to −10° C. to −30° C.

16. The method of claim 15, wherein the temperature of the first sandwich structure is lowered to −20° C.

17. The method of claim 12, wherein in step (g), the thin film of ice is removed via natural thawing, heating, or freeze-drying.

18. The method of claim 12, wherein the 2D material is a flake or a continuous film of graphene, hexagonal boron nitride (hBN), MXene, transitional metal dichalcogenide, transitional metal oxide, or doubled hydroxide.

19. The method of claim 18, wherein,
the continuous film of transitional metal dichalcogenide is selected from the group consisting of $MoS_2$, $ReS_2$, $WS_2$, $MoSe_2$, and $ReSe_2$;
the continuous film of transitional metal oxide that is $Bi_2O_2Se$; or
the flake of doubled hydroxide is hydrotalcite.

20. The method of claim 12, wherein,
the growth substrate is made of one or more material selected from the group consisting of silicon dioxide, metal, fluorophlogopite, sapphire and a combination thereof; and
the target substrate is made of one or more material selected from the group consisting of carbon, silicon dioxide, glass, ceramic, metal, fluorophlogopite, sapphire, thermoplastic, and a combination thereof.

21. The method of claim 20, wherein
the growth substrate or the target substrate is made of the metal, which is copper (Cu), nickel (Ni), platinum (Pt), or gold (Au); and
the thermoplastic is polycarbonate (PC), polydimethylsiloxane (PDMS), polyethylene (PE), poly(ethylene terephthalate) (PET), polypropylene (PP), polyvinylchloride (PVC), poly(methyl methacrylate) (PMMA), polystyrene (PS), or epoxy resin.

22. The method of claim 21, wherein the target substrate is a transmission electron microscopy (TEM) grid consisting of, from top to bottom, a layer of the carbon, a layer of the thermoplastic, and a layer of copper.

* * * * *